United States Patent
Lu et al.

(10) Patent No.: US 11,296,083 B2
(45) Date of Patent: Apr. 5, 2022

(54) THREE-DIMENSIONAL (3D), VERTICALLY-INTEGRATED FIELD-EFFECT TRANSISTORS (FETS) ELECTRICALLY COUPLED BY INTEGRATED VERTICAL FET-TO-FET INTERCONNECTS FOR COMPLEMENTARY METAL-OXIDE SEMICONDUCTOR (CMOS) CELL CIRCUITS

(71) Applicant: QUALCOMM Incorporated, San Diego, CA (US)

(72) Inventors: Ye Lu, San Diego, CA (US); Lixin Ge, San Diego, CA (US); Kwanyong Lim, San Diego, CA (US); Jun Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/811,762

(22) Filed: Mar. 6, 2020

(65) Prior Publication Data

US 2021/0280582 A1    Sep. 9, 2021

(51) Int. Cl.
*H01L 27/092*    (2006.01)
*H01L 23/522*    (2006.01)
(Continued)

(52) U.S. Cl.
CPC ........ *H01L 27/092* (2013.01); *H01L 21/8221* (2013.01); *H01L 21/823807* (2013.01);
(Continued)

(58) Field of Classification Search
CPC .............. H01L 27/3279; H01L 21/768; H01L 23/5226; H01L 23/60
(Continued)

(56) References Cited

U.S. PATENT DOCUMENTS 5,041,884 A   *   8/1991   Kumamoto ....... H01L 29/78642
                                                                            257/347
10,083,963 B2 *   9/2018   Goktepeli ......... H01L 21/76897
(Continued)

OTHER PUBLICATIONS

Loubet N., et al., "Stacked Nanosheet Gate-All-Around Transistor to Enable Scaling Beyond FinFET", Symposium on VLSI Technology Digest of Technical Papers, 2017, 2 Pages.

*Primary Examiner* — Dao H Nguyen
(74) *Attorney, Agent, or Firm* — Withrow & Terranova

(57) ABSTRACT

3D vertically-integrated FETs electrically coupled by integrated vertical FET-to-FET interconnects for reducing an area of CMOS cell circuits are disclosed. Vertically integrated FETs reduce a footprint area of an integrated circuit chip. The FETs include horizontal channel structures that are vertically integrated by stacking a second channel structure of a second FET above a first channel structure of a first FET. The first and second FETs can include a combination of a PFET and NFET that can be used to form a 3D CMOS cell circuit as an example. The area occupied by the 3D CMOS cell circuit includes interconnects for electrically coupling terminal regions of the FETs internally and externally. Vertical FET-to-FET interconnects extend between the FETs to electrically couple terminal regions of the FETs to reduce a number of vias from a semiconductor layer of the 3D CMOS cell circuit to metal interconnect layers above the vertically-integrated FETs.

26 Claims, 14 Drawing Sheets

(51) Int. Cl.
  *H01L 29/417* (2006.01)
  *H01L 29/08* (2006.01)
  *H01L 29/10* (2006.01)
  *H01L 21/822* (2006.01)
  *H01L 21/8238* (2006.01)
  *H01L 29/06* (2006.01)

(52) U.S. Cl.
  CPC ........... *H01L 21/823814* (2013.01); *H01L 21/823871* (2013.01); *H01L 23/5226* (2013.01); *H01L 29/0673* (2013.01); *H01L 29/0847* (2013.01); *H01L 29/1037* (2013.01); *H01L 29/41725* (2013.01)

(58) Field of Classification Search
  USPC ........ 257/369, 347, 621, 761, 774, E23.011, 257/E23.167, E23.169, E21.249, E21.433, 257/E21.476, E21.577, E21.582, E27.026, 257/E27.081, E27.084, E27.112, E29.274, 257/E29.275, E29.298; 438/104, 218, 438/478, 486, 585
  See application file for complete search history.

(56) References Cited

U.S. PATENT DOCUMENTS

| | | | |
|---|---|---|---|
| 10,157,909 B2* | 12/2018 | Or-Bach | H01L 29/66787 |
| 10,522,693 B2* | 12/2019 | Kurokawa | H01L 27/1237 |
| 2006/0124935 A1* | 6/2006 | Bhattacharyya | H01L 27/092 257/67 |
| 2007/0267723 A1* | 11/2007 | Bernstein | H01L 27/0688 257/621 |
| 2009/0068835 A1* | 3/2009 | La Tulipe, Jr. | H01L 23/481 438/656 |
| 2010/0035393 A1* | 2/2010 | Aitken | H01L 21/84 438/218 |
| 2010/0308471 A1* | 12/2010 | Korogi | H01L 24/05 257/774 |
| 2013/0178048 A1* | 7/2013 | Sun | H01L 21/76889 438/478 |
| 2014/0091366 A1* | 4/2014 | Jeon | H01L 27/0605 257/195 |
| 2014/0225235 A1* | 8/2014 | Du | H01L 23/5225 257/659 |
| 2016/0359473 A1* | 12/2016 | Tsai | H03K 5/14 |
| 2019/0206736 A1* | 7/2019 | Sills | H01L 23/5226 |

* cited by examiner

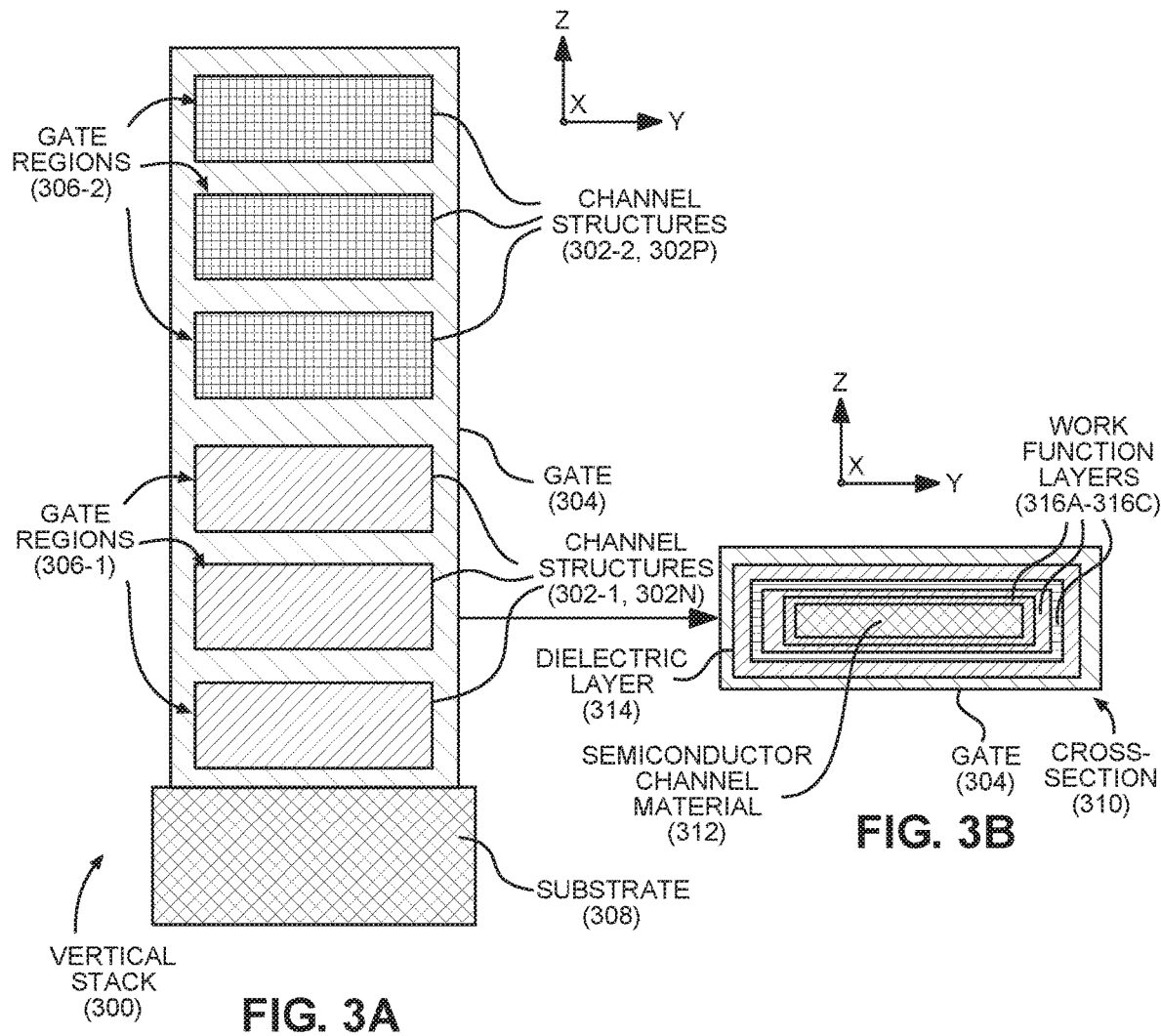

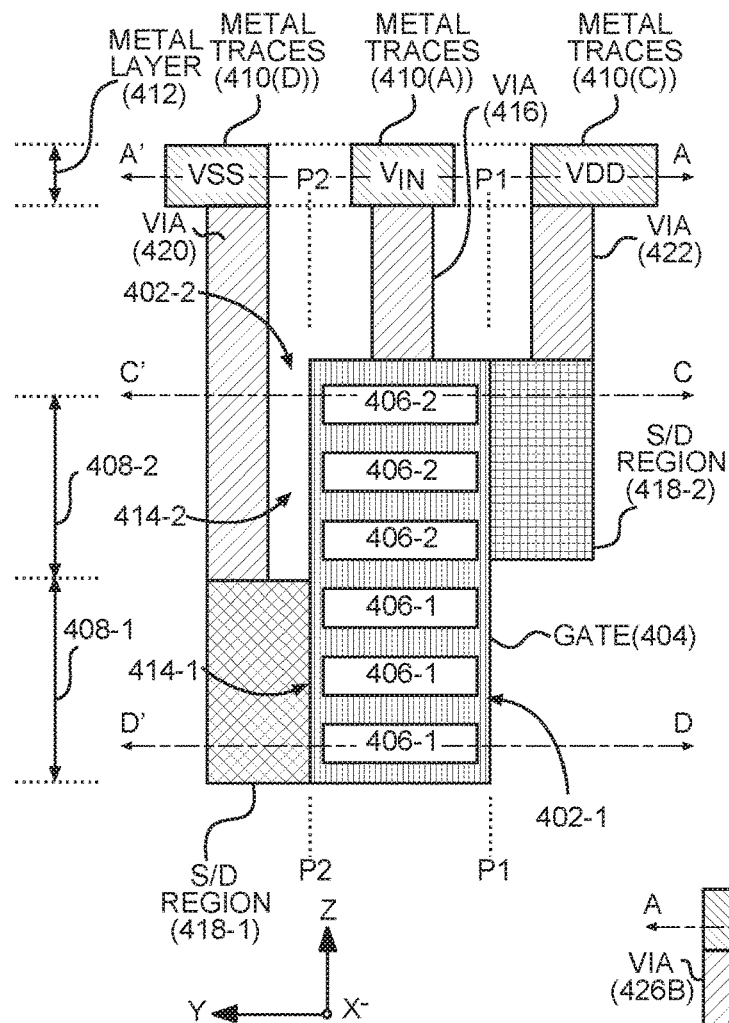
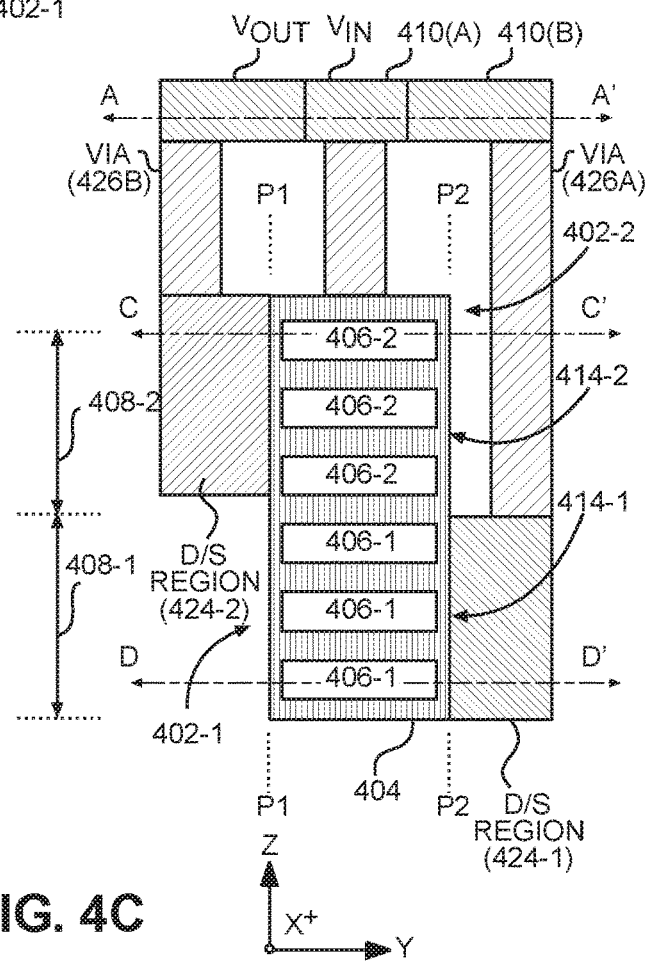
FIG. 4B
FIG. 4C

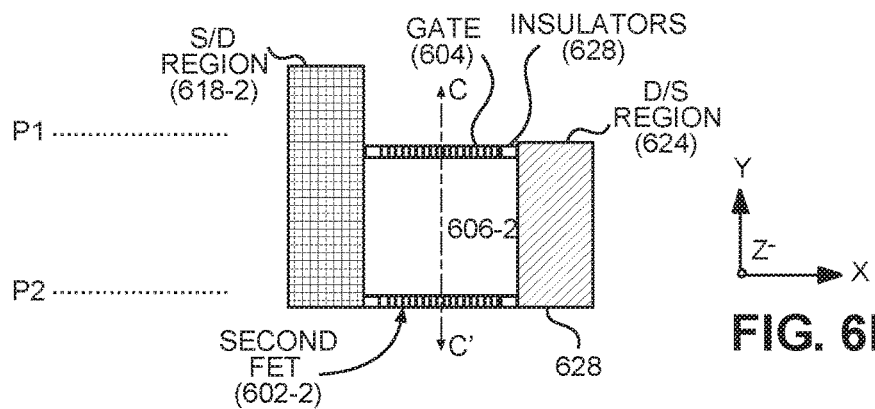
FIG. 6E
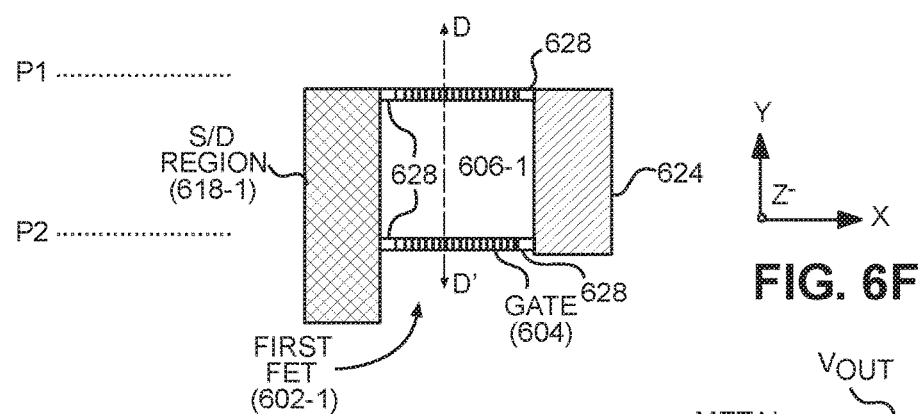
FIG. 6F
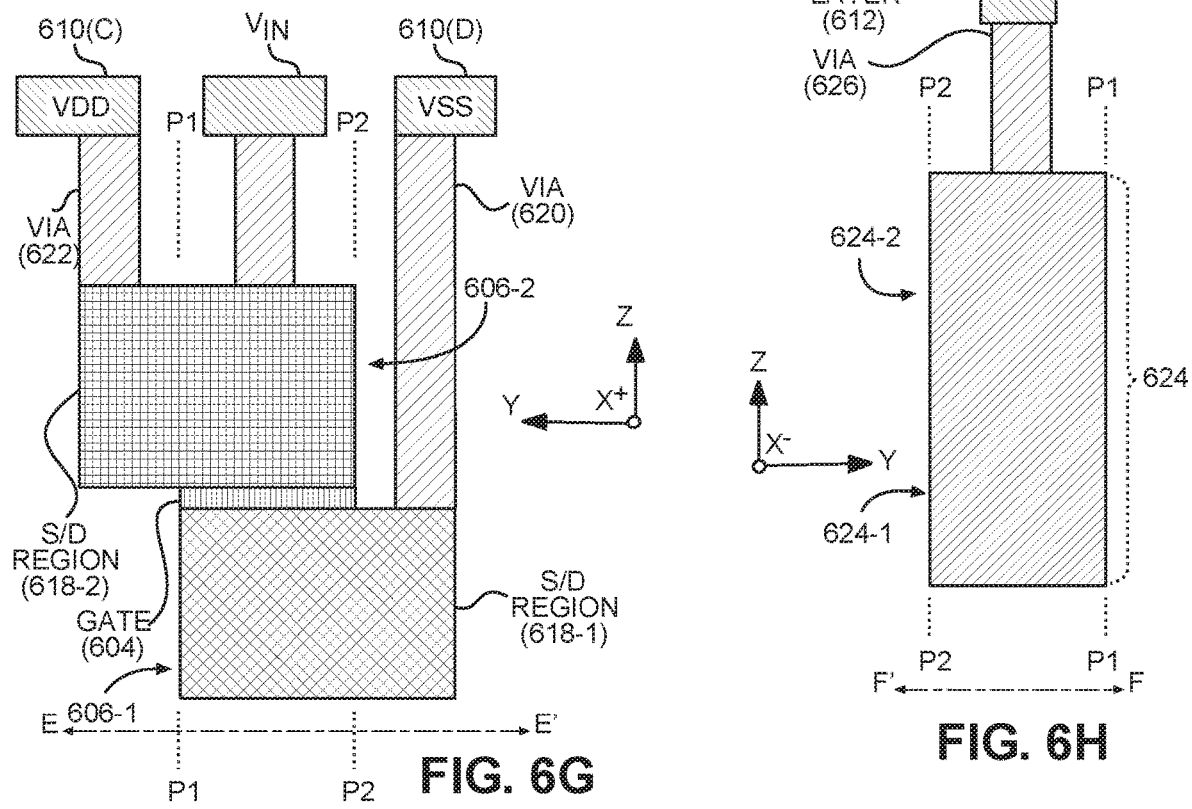
FIG. 6G
FIG. 6H

US 11,296,083 B2

THREE-DIMENSIONAL (3D), VERTICALLY-INTEGRATED FIELD-EFFECT TRANSISTORS (FETS) ELECTRICALLY COUPLED BY INTEGRATED VERTICAL FET-TO-FET INTERCONNECTS FOR COMPLEMENTARY METAL-OXIDE SEMICONDUCTOR (CMOS) CELL CIRCUITS

BACKGROUND

I. Field of the Disclosure

The technology of the disclosure relates generally to complementary metal-oxide semiconductor (CMOS) circuits and, more specifically, to three-dimensional (3D) cell circuit architectures for realization of CMOS cell circuits.

II. Background

Integrated circuits (ICs) such as central processing units (CPUs) and memory systems in modern electronics employ large numbers of transistors. Field-Effect Transistors (FETs) are a transistor technology widely used in logic circuits and memory devices. In particular, a FET may be a P-type in which a majority of charge carriers are positive, or an N-type in which a majority of charge carriers are negative. Metal-oxide semiconductor (MOS) FETs (MOSFETs) of P-type and N-type are referred to as PMOS FETs (PFETs) and NMOS FETs (NFETs), respectively. Complementary MOS (CMOS) logic circuits are formed of PFETs and NFETs coupled together in complementary configurations that provide performance, power reduction, and noise resistance advantages over other circuit designs. CMOS circuits are so commonly used in ICs that standardized cell designs have been developed for CMOS circuits implementing binary logic gates sometimes called "standard cells," "cell circuits" or "CMOS cell circuits." By minimizing the dimensions of these CMOS cell circuits, IC design automation tools are able to generate densely organized (i.e., area efficient) circuit layouts. With market demand for electronic devices to include more functionality in a smaller package, there is pressure to further reduce the area of each CMOS cell circuit for a corresponding reduction in the total area of an IC.

A physical layout of a CMOS cell circuit identifies an arrangement of all elements of the cell circuit, including at least one PMOS transistor (e.g., PFET), at least one NMOS transistor (e.g., NFET), interconnects between terminals of the PMOS and NMOS transistors, and contacts to power, ground, and other circuits. The physical layout of these elements determines a total area or footprint of a CMOS cell circuit. The total area of an IC is determined by not only the total semiconductor footprints of the CMOS cell circuits, but also by the density of the arrangement of CMOS cell circuits. This area may increase as a result of a high congestion of metal traces in the metal interconnect layers above the CMOS cell circuits.

In this regard, FIG. 1 is a schematic diagram of a CMOS cell circuit 100 of a binary inverter logic gate 102 that includes a PFET 104P and an NFET 104N. The voltage $V_{OUT}$ is high (e.g., 5 Volts (V)) if the voltage $V_{IN}$ is low (e.g., 0 V), and the voltage $V_{OUT}$ is low if the voltage $V_{IN}$ is high. The CMOS cell circuit 100 includes external terminals for connecting to a power supply voltage VDD, a ground voltage VSS, the input voltage $V_{IN}$, and the output voltage $V_{OUT}$. Both of the PFET 104P and the NFET 104N include a gate, GP and GN, respectively, coupled to the input $V_R$, and a drain, DP and DN, respectively, coupled to the output voltage $V_{OUT}$.

FIG. 2 is a top view of a circuit cell 200 according to a cell layout 201 that realizes the CMOS cell circuit 100 in FIG. 1. The CMOS cell circuit 100 is disposed on a substrate 202. The top view, facing down in a direction of a Z-axis, is a view of the substrate 202 extending in a plane defined by an X-axis and a Y-axis, with the X, Y, and Z axes being orthogonal to each other. The cell layout 201 includes a P-type region 204P of the substrate 202 for a PFET 206P and an N-type region 204N for an NFET 206N. The cell layout 201 also includes an isolation region 208 between the P-type region 204P and the N-type region 204N. Metal traces (not shown) are formed in the metal layers above the N-type region 204N and the P-type region 204P to provide internal and external circuit connections. Vertical interconnect accesses (vias) 210P, shown in FIG. 2, provide connections between the metal traces and the PFET 206P. Similarly, vias 210N provide connections between the metal traces and the NFET 206N, and a via 210G provides a connection between the metal traces and a gate 212. A total area or footprint of the substrate 202 occupied by the cell layout 201 of the CMOS cell circuit 100 is directly related to the sizes and layouts of the P-type region 204P, the N-type region 204N, and the isolation region 208. The density at which the CMOS cell circuit 100 and other circuits can be placed on the substrate 202 can also be limited by the congestion of the metal traces employed in the layout 200. The number and location of the vias 210P, 210N, and 210G can affect the sizes of the P-type region 204P and the N-type region 204N, and determine the number of metal traces formed in the metal layers to interconnect the PFET 206P and the NFET 206N in the CMOS cell circuit 100. Thus, the total area of an IC is determined by a combination of the areas of the substrate 202 occupied by the cell layout 201 and the congestion of interconnects in the metal layers above the cell layout 201.

It may be desired to minimize the total area of a CMOS cell circuit, such as the circuit cell 200 realizing the CMOS cell circuit 100 in FIG. 2.

SUMMARY OF THE DISCLOSURE

Aspects disclosed herein include three-dimensional (3D), vertically-integrated Field-Effect Transistors (FETs) electrically coupled by integrated vertical FET-to-FET interconnects for complementary metal-oxide semiconductor (CMOS) cell circuits. Related methods are also disclosed. In exemplary aspects, 3D CMOS cell circuits employ vertically-integrated FETs to reduce a footprint area of an integrated circuit (IC) chip. The FETs include horizontally-disposed channel structures that are vertically integrated by stacking a second channel structure of a second FET above a first channel structure of a first FET in a height direction of the CMOS cell circuit. The first and second FETs can include a combination of a P-type FET (PFET) and an N-type FET (NFET) that can be used to form a CMOS cell circuit as an example. A total area of a 3D CMOS cell circuit is reduced by having the second channel structure of the second FET vertically stacked either partially or wholly above the first channel structure of the first FET within a horizontal area of a semiconductor substrate occupied by the first channel structure. The area of the 3D CMOS cell circuit further includes interconnects for electrically coupling respective terminal regions of the FETs to each other and to an external circuit.

In this regard, in examples disclosed herein, the 3D CMOS cell circuit also includes vertical FET-to-FET interconnects extending between the vertically-integrated FETs. A vertical FET-to-FET interconnect is an electrically conductive element that extends in a vertical direction between a terminal region of a first FET and a terminal region of a second FET. The use of vertical FET-to-FET interconnects is possible where FETs are vertically-integrated and vertically-aligned terminal regions of the respective vertically-integrated FETs are electrically coupled to each other. Employing a vertical FET-to-FET interconnect can eliminate the need for a first vertical interconnect access (via) extending from a terminal region of the first FET up to the metal layers, a second via extending from a terminal region of the second FET up to the metal layers, and a metal layer interconnect between the first and second vias, as a non-limiting example. Thus, the use of vertical FET-to-FET interconnects can reduce a number of vias from a semiconductor layer of the 3D CMOS cell circuit to metal interconnect layers and reduces a number of metal traces in the metal layers. Since vias are located horizontally outside the terminal regions of the vertically-integrated FETs in the CMOS cell circuit, reducing the number of vias can reduce the horizontal area of a 3D CMOS cell circuit. Reducing the number of metal traces reduces congestion of routing tracks above the 3D CMOS cell circuit, allowing the 3D CMOS cell circuits in an IC to be more densely arranged and reduce an area of the IC.

In this regard, in one aspect, a CMOS cell circuit is disclosed herein. The CMOS cell circuit includes a first semiconductor layer including a first FET, and a second semiconductor layer including a second FET. The first FET includes a first semiconductor channel structure having a first longitudinal axis in a length direction and extending in a width direction orthogonal to the length direction. The second semiconductor layer is disposed above the first semiconductor layer in a vertical direction orthogonal to the length direction and the width direction. The second FET includes a second semiconductor channel structure having a second longitudinal axis in the length direction and extending in the width direction, the second FET disposed above the first FET in the vertical direction. The CMOS cell circuit also includes a vertical FET-to-FET interconnect extending in the vertical direction between a first terminal region of the first FET and a first terminal region of the second FET, the vertical FET-to-FET interconnect electrically coupling the first terminal region of the first FET and the first terminal region of the second FET.

In another aspect, a method of fabricating a CMOS cell circuit is disclosed. The method includes forming a first semiconductor layer including forming a first FET, and forming a second semiconductor layer including forming a second FET. Forming the first FET includes forming a first semiconductor channel structure extending longitudinally in a length direction and extending in a width direction orthogonal to the length direction. Forming the second semiconductor layer includes forming the second FET above the first FET in a vertical direction orthogonal to the length direction and the width direction. Forming the second FET includes forming a second semiconductor channel structure above the first semiconductor channel structure in the vertical direction, the second semiconductor channel structure extending longitudinally in the length direction and extending in the width direction. The method further includes forming a vertical FET-to-FET interconnect extending in the vertical direction between a first terminal region of the first FET and a first terminal region of the second FET, the vertical FET-to-FET interconnect electrically coupling the first terminal region of the first FET and the first terminal region of the second FET.

BRIEF DESCRIPTION OF THE FIGURES

FIG. 3A is a cross-sectional side view of an exemplary vertical stack of gate-all-around (GAA) semiconductor channel structures including a vertically-integrated first Field-Effect Transistor (FET) of a first type stacked beneath a second FET of a second type and a vertical FET-to-FET interconnect to electrically couple the first and second FETs;

FIG. 3B is a close-up cross-sectional view illustrating layers of one of the GAA semiconductor channel structures in the first FET in FIG. 3A;

FIG. 4B is a cross-sectional view of a vertical cross-section of the 3D CMOS cell circuit in FIG. 4A including first and second GAA semiconductor channel structures, source regions of a first FET and a second FET, and vias to external connections;

FIG. 4C is a cross-sectional view of the vertical cross-section in FIG. 4A of the 3D CMOS cell circuit in FIG. 4A including the first and second GAA semiconductor channel structures, drain regions of the first FET and the second FET, and vias to external connections;

FIGS. 6B-6H are cross-sectional views, corresponding to the views in FIGS. 4B-4H, of the 3D CMOS cell circuit in FIG. 6A;

DETAILED DESCRIPTION

Figure 1:
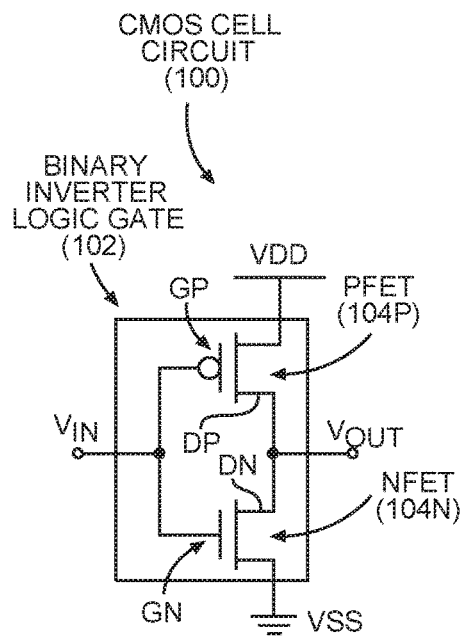
FIG. 1 is a schematic diagram of a complementary metal-oxide semiconductor (CMOS) cell circuit for a binary inverter logic gate.
Figure 2:
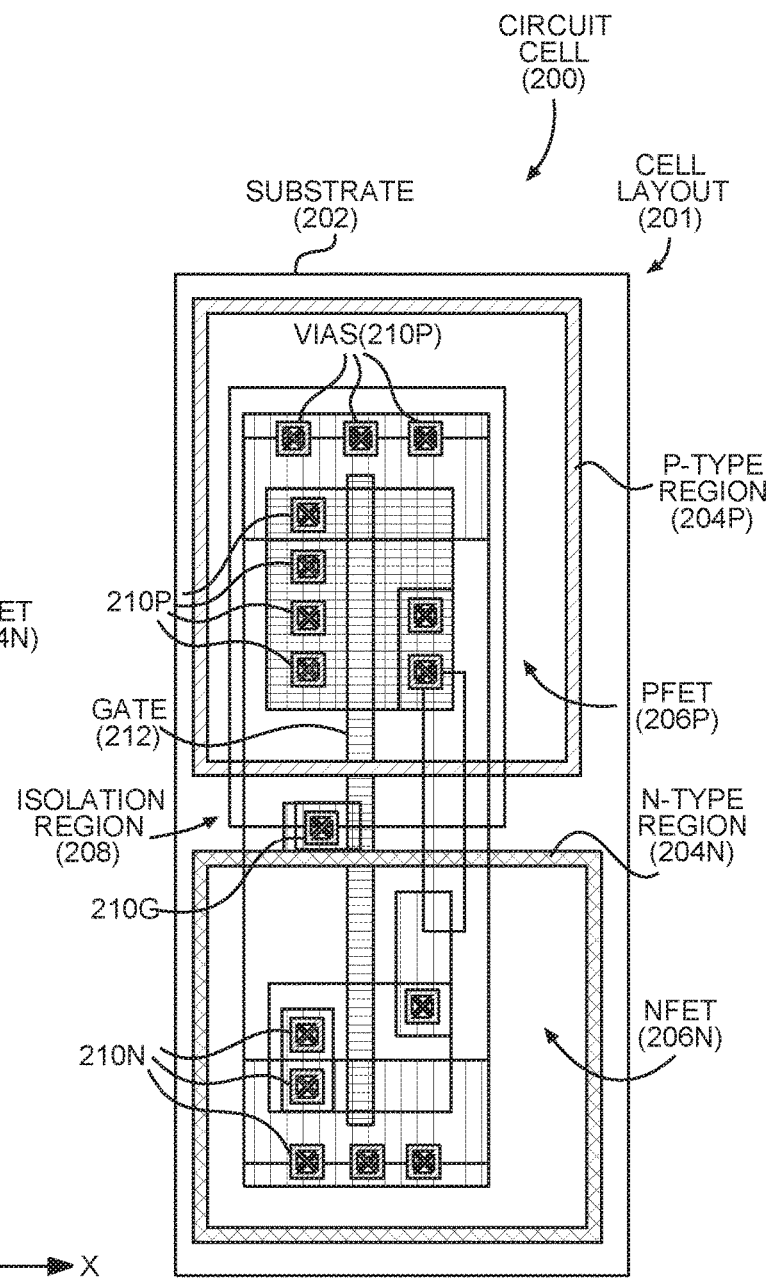
FIG. 2 is a top view of a physical layout of the CMOS cell circuit of FIG. 1 including horizontally-disposed diffusion regions of a substrate and interconnects.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include three-dimensional (3D), vertically-integrated Field-Effect Transistors (FETs) electrically coupled by integrated vertical FET-to-FET interconnects for complementary metal-oxide semiconductor (CMOS) cell circuits. Related methods are also disclosed. In exemplary aspects, 3D CMOS cell circuits employ vertically-integrated FETs to reduce a footprint area of an integrated circuit (IC) chip. The FETs include horizontally-disposed channel structures that are vertically integrated by stacking a second channel structure of a second FET above a first channel structure of a first FET in a height direction of the CMOS cell circuit. The first and second FETs can include a combination of a P-type FET (PFET) and an N-type FET (NFET) that can be used to form a CMOS cell circuit as an example. A total area of a 3D CMOS cell circuit is reduced by having the second channel structure of the second FET vertically stacked either partially or wholly above the first channel structure of the first FET within a horizontal area of a semiconductor substrate occupied by the first channel structure. The area of the 3D CMOS cell circuit further includes interconnects for electrically coupling respective terminal regions of the FETs to each other and to an external circuit.

In this regard, in examples disclosed herein, the 3D CMOS cell circuit also includes vertical FET-to-FET interconnects extending between the vertically-integrated FETs. A vertical FET-to-FET interconnect is an electrically conductive element that extends in a vertical direction between a terminal region of a first FET and a terminal region of a second FET. The use of vertical FET-to-FET interconnects is possible where FETs are vertically-integrated and vertically-aligned terminal regions of the respective vertically-integrated FETs are electrically coupled to each other. Employing a vertical FET-to-FET interconnect can eliminate the need for a first vertical interconnect access (via) extending from a terminal region of the first FET up to the metal layers, a second via extending from a terminal region of the second FET up to the metal layers, and a metal layer interconnect between the first and second vias, as a non-limiting example. Thus, the use of vertical FET-to-FET interconnects can reduce a number of vias from a semiconductor layer of the 3D CMOS cell circuit to metal interconnect layers and reduces a number of metal traces in the metal layers. Since vias are located horizontally outside the terminal regions of the vertically-integrated FETs in the CMOS cell circuit, reducing the number of vias can reduce the horizontal area of a 3D CMOS cell circuit. Reducing the number of metal traces reduces congestion of routing tracks above the 3D CMOS cell circuit, allowing the 3D CMOS cell circuits in an IC to be more densely arranged and reduce an area of the IC.

FIG. 3A is a cross-sectional side view in an X-axis direction of an exemplary vertical stack 300 of first gate-all-around (GAA) semiconductor channel structures ("channel structures") 302-1 and second channel structures 302-2. FIG. 3A shows that the first channel structures 302-1 are vertically integrated with the second channel structures 302-2. At the cross-section shown in FIG. 3A, a gate 304 electrically couples a gate region 306-1 of the first channel structures 302-1 to a gate region 306-2 of the second channel structures 302-2. The gate regions 306-1 and 306-2 are examples of terminal regions of a FET. As known in the art, other terminal regions of a FET, not shown in FIG. 3A, include source regions and drain regions, also referred to herein as S/D and D/S regions. Thus, a terminal region is a physical portion of a FET to which an electrical signal (e.g., voltage and/or current) may be applied to control operation of the FET or from which an electrical signal is generated according to operation of the FET.

The gate 304 is one example of a vertical FET-to-FET interconnect to reduce a number of vias and metal traces. The use of a vertical FET-to-FET interconnect is made possible by the vertically-stacked gate regions 306-1 and 306-2 of the respective channel structures 302-1 and 302-2. The gate 304 occupies less horizontal area than would be occupied by the use of vias to the metal layers to electrically couple the gate regions 306-1 and 306-2 of the first and second channel structures 302-1 and 302-2. The first channel structures 302-1 correspond to an NFET, in which a majority of charge carriers are negative, and the second channel structures 302-2 correspond to a PFET, in which a majority of charge carriers are positive. Thus, in the example of the vertical stack 300, the first channel structures 302-1 may also be referred to as 302N, indicating N-type, and the second channel structures 302-2 may also be referred to as 302P, indicating P-type. In an alternative embodiment, the first channel structures 302-1 correspond to a PFET and the second channel structures 302-2 correspond to an NFET.

The channel structures 302P are vertically stacked either partially or wholly above the channel structures 302N in the Z-axis direction. In one example, the channel structures 302P and the channel structures 302N each extend within a same horizontal area (e.g., in the X-axis or the Y-axis directions). In other words, the channel structures 302P may be stacked wholly above the channel structures 302N, or vice versa. In another example, the channel structures 302P extend in a direction orthogonal to (i.e., above or below) the channel structures 302N, such that at least part of a horizontal area occupied by the channel structures 302P is also occupied by at least a part of the channel structures 302N.

In other words, the channel structures 302P may be stacked partially above the channel structures 302N. In this regard, the horizontal area occupied by the vertical stack 300 is much less (e.g., approximately half) than the area occupied by horizontally-disposed P-type and N-type diffusion regions of a substrate in conventional GAA FETs.

In CMOS circuits for many binary operator logic gates, the gate regions 306-1 of the channel structures 302-1 of a first FET and the gate regions 306-2 of the channel structures 302-2 of a second FET are electrically coupled to each other. For example, as shown in the schematic diagram of the CMOS cell circuit 100 for a binary inverter logic gate in FIG. 1, the gates GP and GN are electrically coupled to each other. In this regard, in the vertical stack 300 in FIG. 3, the channel structures 302-2 are stacked wholly above (i.e., extending in the same direction) the channel structures 302-1. The gate 304 is a vertical FET-to-FET interconnect that electrically couples the gate regions 306-1 of the channel structures 302-1 and the gate regions 306-2 of the channel structures 302-2. The gate 304 is implemented as a vertical FET-to-FET interconnect to where the gate regions 306-1 of the first FET are vertically stacked beneath (or above) the gate regions 306-2 of the second FET on a substrate 308.

FIG. 3B is a close-up view of a cross-section 310 of one example of a channel structure 302N or 302P, in which an innermost layer is a semiconductor channel material 312 of a P-type or N-type. Between the gate 304 and the semiconductor channel material 312, in this example, are a dielectric layer 314 in contact with the gate 304, and a plurality of work-function layers 316A, 316B, and 316C between the dielectric layer 314 and the semiconductor channel material 312. A GAA semiconductor channel structure 302-1 and 302-2 as used herein is not limited to having the layers or the number of channel structures shown in FIG. 3B.

In the vertical stack 300, the channel structures 302-1 and 302-2 extend in the same direction such that the channel structures 302-2 wholly overlap the channel structures 302-1. In an alternative example, the channel structures 302-1 and 302-2 may only partially overlap such that a S/D region or a D/S region (not shown) at an end of the channel structures 302-1, or the gate regions 306-1 is directly beneath a terminal region of the channel structures 302-2.

In this regard, to electrically couple at least one terminal region of a lower FET that is stacked partially or wholly beneath an upper FET to a metal layer above a cell circuit, a via extending to/from the metal layers must avoid the upper FET. The lower FET requires a horizontal conductor to extend away from the terminal region of the lower FET and outside a vertical space of the upper FET so a via to the metal layers is unobstructed. Further, a metal layer to which the via connects may include parallel metal tracks that are separated at a track pitch from each other. Thus, the horizontal conductor may need to extend at least the distance of such track separation so a via can be positioned beneath a metal track. Such horizontal conductors increase the horizontal area occupied by a cell circuit formed of stacked FETs. As the number of stacked FETs in a cell circuit increases, the number of horizontally-extending conductors may increase, and the horizontal area occupied by the cell circuit may further increase.

Employing vertical FET-to-FET interconnects where a terminal region of a first FET is directly, vertically above a terminal region of a second FET to which the terminal region of the first FET is electrically coupled, minimizes the horizontal area occupied by a cell circuit. In such situations, a vertical FET-to-FET interconnect that electrically couples terminal regions of vertically-stacked FETs may or may not require a via for a metal layer connection. If no metal layer connection is required, the vertical FET-to-FET interconnect is not subject to the horizontal track separation distance of the metal layers. Even if the vertical FET-to-FET interconnect requires some horizontal separation from the channel structures, this horizontal distance may be significantly reduced compared to a circuit in which vias are used to electrically couple such terminal regions in the metal layers. Further, if a metal layer connection is required from the vertical FET-to-FET interconnect to the metal layers, the via may extend vertically from the terminal region of the upper FET, thereby eliminating the need for a horizontal conductor. Examples of cell circuits formed of vertically-stacked FETs including terminal regions coupled by vertical FET-to-FET interconnects, as discussed above, are presented herein.

An example of a layout of a vertically-integrated 3D CMOS cell circuit for the binary inverter logic gate 102 in FIG. 1 is illustrated in FIGS. 4A-4H. FIGS. 4A-4H are two-dimensional (2D) illustrations of respective horizontal and vertical cross-sections or cross-sectional views of a first example of a 3D CMOS cell circuit ("cell circuit") 400. Aspects of the 3D physical layout, including vertically-stacked FETs 402-1 and 402-2, and a vertical FET-to-FET interconnect 404, reduce the horizontal area occupied by the cell circuit 400, and increase the density with which such cell circuits 400 can be organized in an IC. The illustrations in FIGS. 4A-4H provide a view of the vertically-stacked FETs 402-1 and 402-2, the vertical FET-to-FET interconnect 404, and other aspects of the cell circuit 400. The first FET 402-1 includes GAA semiconductor channel structures ("channel structures") 406-1 in a first semiconductor layer 408-1, and the second FET 402-2 includes channel structures 406-2 in a second semiconductor layer 408-2. The channel structures 406-1 and 406-2 in the cell circuit 400 are vertically stacked like the vertical stack 300 of the channel structures 306-1 and 306-2 in FIG. 3A. The cell circuit 400 also includes a gate 404, which is the vertical FET-to-FET interconnect 404 corresponding to the gate 304 in FIG. 3A.

The perspective of each of the FIGS. 4A-4H is described with respect to X, Y, and Z axes, each of which is orthogonal to the other axes. A positive direction along an axis is indicated by an arrow, with a negative direction being opposite to the direction indicated by the arrow. An axis notation on each figure indicates whether the view into the figure (i.e., orthogonal to a figure) is in a positive or negative direction of an axis (e.g., Z+ or Z−). A view or cross-section in a plane of the X-axis and Y-axis is referred to herein as a "horizontal" view or cross-section. A view or cross-section in a plane including the Z-axis, with either the X-axis or the Y-axis, is referred to herein as a "vertical" view or cross-section. Features shared in common between FIGS. 4A-4H are numbered alike and are more easily understood by viewing the different perspectives provided. Since some features of a 3D structure can only be seen from a particular perspective, a discussion of a particular figure may refer to a labeled feature that is not actually visible in the figure being discussed, but such feature may be viewed in another one of the FIGS. 4A-4H.

In the cell circuit 400, the first FET 402-1 is an NFET, and the second FET 402-2 is a PFET stacked above the first FET 402-1. In another example (not shown), an inverter circuit corresponding to the CMOS cell circuit 100 in FIG. 1 could also be implemented with an NFET stacked above a PFET and employ a vertical FET-to-FET interconnect to electrically couple the respective gate regions for reduced horizontal area. As the function of an inverter logic gate is well understood, FIGS. 4A-4H are primarily provided to assist in understanding the 3D physical layout of a first example of the cell circuit 400, as described below.

Figure 4A:
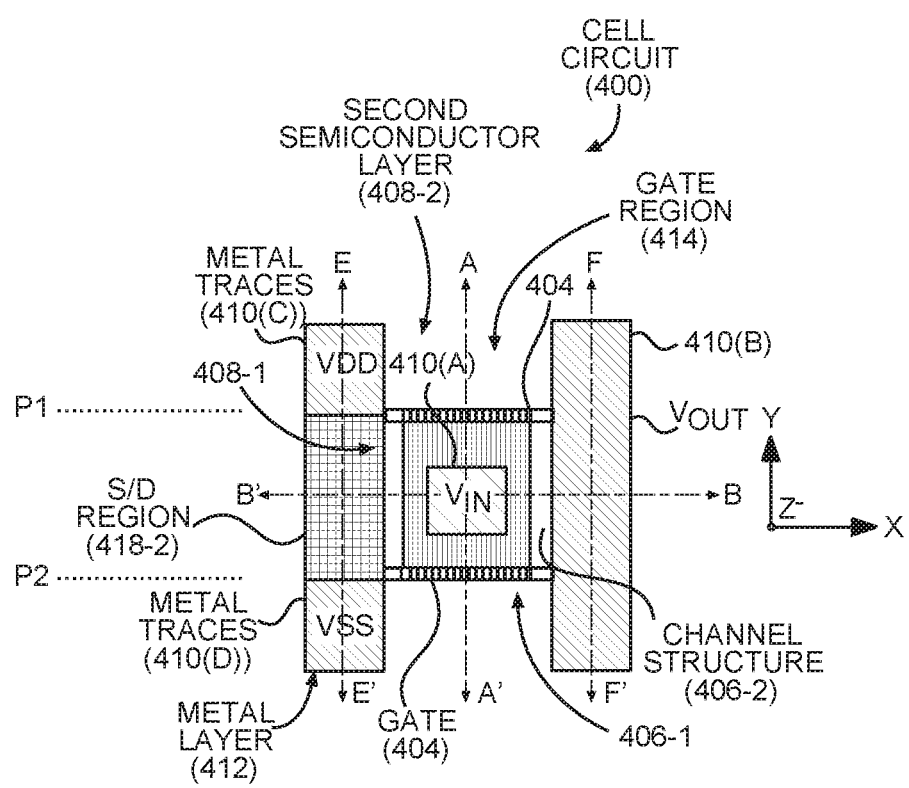
FIG. 4A is a top view of an exemplary layout of a vertically-integrated three-dimensional (3D) CMOS cell circuit for the binary inverter logic gate in FIG. 1 including first and second FETs with stacked GAA semiconductor channel structures as shown in FIG. 3A and a vertical FET-to-FET interconnect.

FIG. 4A is a top view, downward in a negative Z-axis direction, of a horizontal cross-section of a channel structure 406-2 in the cell circuit 400. FIG. 4A shows the horizontal area occupied by features of the cell circuit 400, including the channel structure 406-2. The channel structure 406-2 shown in FIG. 4A is stacked above other channel structures 406-2 of the second semiconductor layer 408-2, which are stacked above the channel structures 406-1 of the first semiconductor layer 408-1, as discussed with reference to FIG. 4B. By stacking the first FET 402-1 beneath the second FET 402-2, the horizontal area occupied by the cell circuit 400 is reduced. FIG. 4A also includes horizontal cross-sections of metal traces 410(A)-410(D) in a metal layer 412. The metal layer 412 is representative of one or more metal layers that may be needed to provide the appropriate internal and external connections for the cell circuit 400, but will be referred to herein collectively as the metal layer 412. The metal layer 412 also couples the cell circuit 400 to a ground voltage VSS, a power supply voltage VDD, an input $V_{IN}$, and an output $V_{OUT}$. The vertical cross-section along line A-A' in FIG. 4A extends in the Y-axis direction (see FIGS. 4B and 4C) through gate regions 414-1 and 414-2 of the channel structures 406-1 and 406-2, respectively. The gate regions 414-1 and 414-2 are examples of terminal regions of the first FET 402-1 and the second FET 402-2, respectively.

The vertical cross-section along line B-B' in FIG. 4A extends in the X-axis direction (see FIG. 4D) along longitudinal axes of the first FET 402-1 and the second FET 402-2. Cross-sections along lines E-E' and F-F' in FIG. 4A will be explained with reference to FIGS. 4G and 4H. Planes P1 and P2 are vertical planes (in the X axis direction) shown in each of FIGS. 4A-C and 4E-4H for perspective.

In particular, FIG. 4A shows the gate 404 extending over the top surface of the channel structure 406-2 and a metal trace 410(A) coupled to the input $V_{IN}$ and also to the gate 404. FIG. 4A further shows a metal trace 410(B) coupled to the output $V_{OUT}$, a metal trace 410(C) coupled to the power supply voltage VDD, and a metal trace 410(D) coupled to the ground voltage VSS. Between the metal traces 410(C) and 410(D), a first source/drain (S/D) region 418-2 is visible from the top view in FIG. 4A.

FIG. 4B is a view in the negative X-axis direction (i.e., the width direction) of the cell circuit 400 at a cross-section taken at line A-A' in FIG. 4A, and FIG. 4C is a view in the positive X-axis direction (i.e., left to right in FIG. 4A) of the cell circuit 400 at the cross-section A-A'. FIG. 4B corresponds to the cross-sectional view of the vertical stack 300 in FIG. 3A, and further illustrates that the gate regions 414-1 and 414-2 of the vertically-stacked FETs 402-1 and 402-2 can be electrically coupled by the vertical FET-to-FET interconnect 404 to reduce the horizontal area occupied by the cell circuit 400. The vertical FET-to-FET interconnect 404 also reduces congestion of metal layer interconnects to increase the density with which such cell circuits 400 can be organized in an IC. FIGS. 4B and 4C show the first and second semiconductor layers 408-1 and 408-2 in which the first FET 402-1 and the second FET 402-2, respectively, are formed. The channel structures 406-1 in the first semiconductor layer 408-1 are N-type (NMOS) semiconductor channels in this example. The channel structures 406-2 in the second semiconductor layer 408-2 in this example are P-type (PMOS) semiconductor channels.

As shown here, the gate region 414 of FIG. 4A includes the gate region 414-1 in the channel structures 406-1 and the gate region 414-2 in the channel structures 406-2. In the cross-section A-A', the gate 404 extends from the gate region 414-1 of the channel structures 406-1 to the gate region 414-2 of the channel structures 406-2 to electrically couple the gate region 414-1 of the first FET 402-1 and the gate region 414-2 the second FET 402-2. For this reason, the gate 404 in this example is also referred to as the vertical FET-to-FET interconnect 404. The vertical FET-to-FET interconnect 404 electrically coupling a first terminal region of the first FET 402-1 to a second terminal region of the second FET 402-2 that is vertically stacked on the first FET 402-1 reduces a number of vias required for internal and external connections of the cell circuit 400. The vertical FET-to-FET interconnect 404 extends directly between the first terminal region of the first FET 402-1 and the second terminal region of the second FET 402-2. In this context, the term "extends directly between" indicates that the vertical FET-to-FET interconnect 404 extends in the Z-axis direction from a first terminal region to a second terminal region without first going past the second terminal region in the Z-axis direction (e.g., to a third terminal region and then returning to the second terminal region). For example, a vertical FET-to-FET interconnect extending directly between two layers includes at least a portion that extends in a straight line from one layer to the other and electrically couples the two layers. The gate 404 couples the gate regions 414-1 and 414-2 to the input $V_{IN}$ in the metal layer 412 by way of a single via 416, as opposed to employing one via for coupling each gate region directly to the metal layer 412. The first FET 402-1 and the second FET 402-2 are GAA-type FETs, which allow the gate 404 to extend over (e.g., around) all surfaces of a perimeter of the channel structures 406-1 and 406-2.

FIG. 4B also shows the S/D region 418-1 coupled to the channel structures 406-1 in the first semiconductor layer 404-1, and the S/D region 418-2 coupled to the channel structures 406-2 in the second semiconductor layer 404-2. The S/D regions 418-1 and 418-2 also examples of terminal regions of the first FET 402-1 and the second FET 402-2, respectively. A via 420 electrically couples the S/D region 418-1 to the metal trace 410(D) in the metal layer 412 to couple to the ground voltage VSS. Similarly, a via 422 electrically couples the S/D region 418-2 to the power supply voltage VDD by way of the metal layer 412.

Referring to FIG. 4C, which shows the opposite face of the cross-section A-A', the channel structures 406-1 and 406-2 and the gate 404 have been described with reference to FIG. 4B. FIG. 4C also shows that drain/source (D/S) regions 424-1 and 424-2 are coupled to the ends of the channel structures 406-1 and 406-2 opposite the S/D regions 418-1 and 418-2. The D/S regions 424-1 and 424-2 are examples of terminal regions of the first FET 402-1 and the second FET 402-2, respectively. The D/S region 424-1 is coupled to the output $V_{OUT}$ by a via 426A to the metal trace 410(B). The D/S region 424-2 is coupled to the D/S region 424-1 and to the output $V_{OUT}$ in the metal layer 412 by a via 426B and the metal trace 410(B). Depending on implementation, terminal regions identified as S/D or D/S may function as either a source or a drain during operation of a corresponding FET. As noted above, the term "terminal region" herein is a physical portion of the FET to which an electrical signal (e.g., voltage and/or current) may be applied to control operation of the FET or from which an electrical signal is generated according to operation of the FET.

Figure 4D:
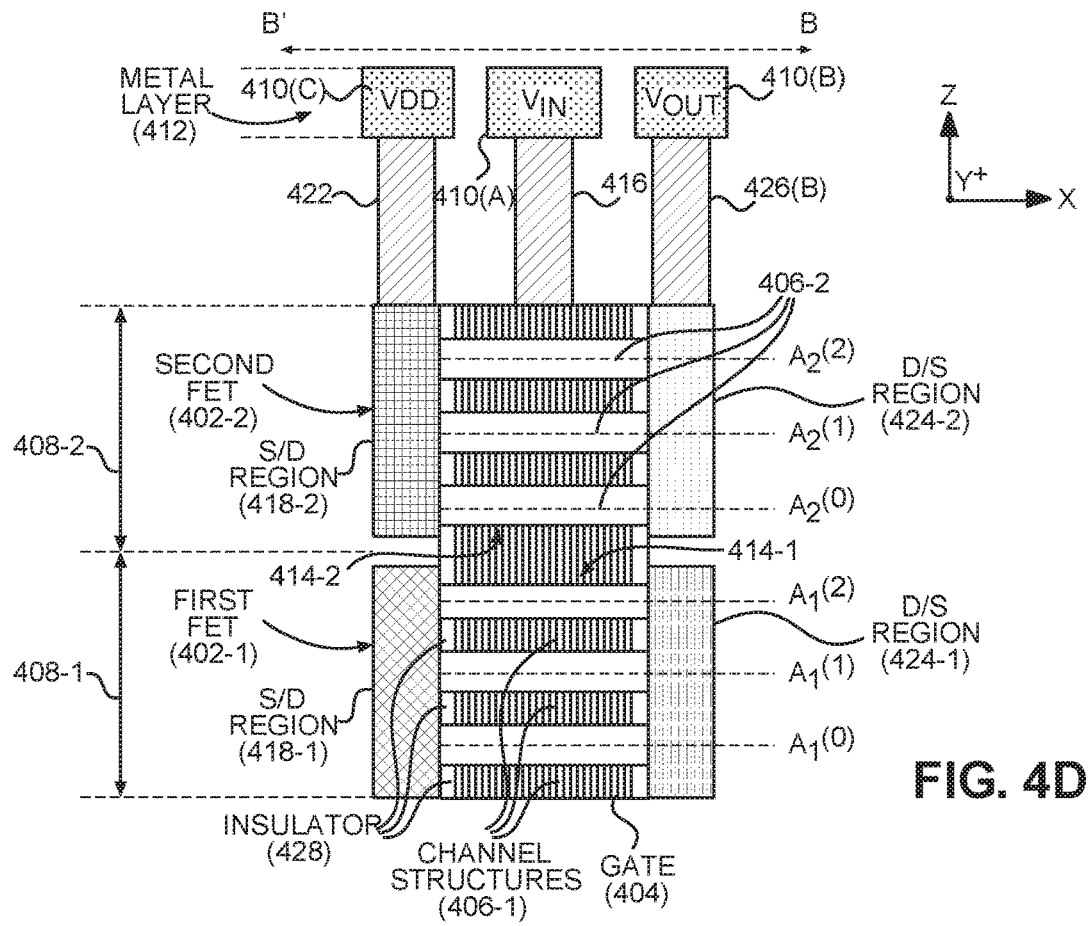
FIG. 4D is a cross-sectional view of the 3D CMOS cell circuit in FIG. 4A including the first and second GAA semiconductor channel structures, gate regions, source/drain regions, and drain/source regions of the first FET and the second FET and vias to external interconnects.

The vertical cross-section in FIG. 4D, taken at line B-B' in FIG. 4A, extends in the length direction (i.e., X-axis direction) along longitudinal axes $A_1(0)$-$A_1(2)$ of the channel structures 406-1 and longitudinal axes $A_2(0)$-$A_2(2)$ of the channel structures 406-2. FIG. 4D is a view in the positive Y-axis direction of the vertical cross-section B-B' in FIG. 4A. FIG. 4D further illustrates that the gate 404 is a vertical FET-to-FET interconnect electrically coupling the vertically-stacked FETs 402-1 and 402-2 to reduce the horizontal area occupied by the cell circuit 400, and reduce congestion of metal layer interconnects to increase the density with which such cell circuits 400 can be organized in an IC. The vertical cross-section B-B' is another horizontally-oriented view orthogonal to the vertical cross-section A-A' in FIGS. 4B and 4C. FIG. 4D illustrates the first semiconductor layer 408-1 including the first FET 402-1. Thus, the first FET 402-1 includes the first channel structures 406-1, which have a first longitudinal axis $A_1(2)$ in the length direction and also extend in the width direction (Y-axis direction).

FIG. 4D also illustrates the second semiconductor layer 408-2 including the second FET 402-2 disposed above first FET 402-1 in the Z-axis direction. The second FET 402-2 includes the channel structures 406-2, which have a second longitudinal axis $A_2(0)$ in the length direction and extend in the width direction. The gate 404 or vertical FET-to-FET interconnect 404 extends in the Z-axis direction and electrically couples the gate region 414-1 of the first FET 402-1 and the gate region 414-2 of the second FET 402-2 to the input $V_{IN}$ by way of the via 416.

As shown in FIG. 4D, the first FET 402-1 includes the S/D region 418-1 at a first end, in the length direction, of the channel structures 406-1, the D/S region 424-1 at a second end of the channel structures 406-1, and the gate region 414-1 between, in the length direction, the S/D region 418-1 and the D/S region 424-1. Similarly, the second FET 402-2 includes the S/D region 418-2 at the first end, in the length direction, of the channel structures 406-2, the D/S region 424-2 at the second end of the channel structures 406-2, and the gate region 414-2 between, in the length direction, the S/D region 418-2 and the D/S region 424-2. Due to the stacking of the second FET 402-2 above the first FET 402-1, the gate region 414-2 is directly above the gate region 414-1, the S/D region 418-2 is directly above the S/D region 418-1, and the D/S region 424-2 is directly above the D/S region 424-1.

Insulators 428 extend around the perimeters of the channel structures 406-1 and 406-2 at each end (in the length direction) to electrically isolate the gate 404 from the first and second S/D regions 418-1 and 418-2 at one end and from the first and second D/S regions 424-1 and 424-2 at the opposite end of the channel structures 406-1 and 406-2.

FIG. 4D shows that the S/D regions 418-1 and 418-2 and the D/S regions 424-1 and 424-2 are all electrically isolated from each other within the first and second semiconductor layers 408-1 and 408-2. For this reason, each of the S/D regions 418-1 and 418-2 and the D/S regions 424-1 and 424-2 is directly coupled to the metal layer 412 by a corresponding via. However, the gate 404 provides a vertical FET-to-FET interconnect 404 extending, in the Z-axis direction, between the gate region 414-1 of the first FET 402-1 and the gate region 414-2 of the second FET 402-2, electrically coupling the gate region 414-1 of the first FET 402-1 to the gate region 414-2 of the second FET 402-2 to eliminate the necessity of having separate vias to the metal layer 412.

Figure 4E:
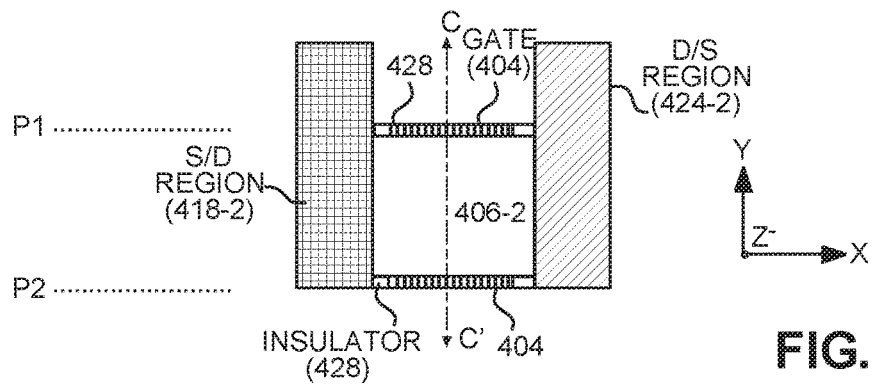
FIG. 4E is a top view of the 3D CMOS cell circuit in FIG. 4A including a second GAA semiconductor channel structure and source/drain regions of the second FET.
Figure 4F:
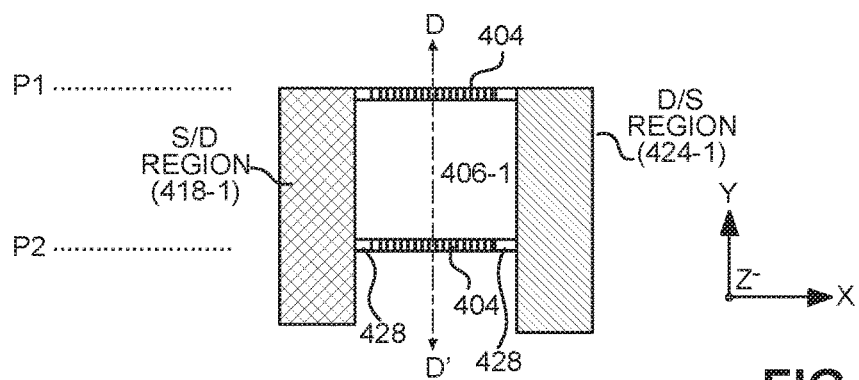
FIG. 4F is a top view of the 3D CMOS cell circuit in FIG. 4A, including a first GAA semiconductor channel structure and source/drain regions of the first FET.

FIGS. 4E and 4F are top views of horizontal cross-sections taken at lines C-C' and D-D', respectively, as indicated in FIGS. 4B and 4C. The horizontal cross-sections in FIGS. 4E and 4F, in addition to FIG. 4A, show a horizontal area occupied by the stacked GAA channel structures 406-1 and 406-2 corresponds to the area of a single channel structure (e.g., 406-1). Thus, by stacking the channel structures 406-1 and 406-2 and employing the gate 404 as a vertical FET-to-FET interconnect, the area of the cell circuit 400 is reduced, the congestion of metal traces is reduced, and CMOS cell circuits 400 may be placed at a higher density in an IC.

The cross-section C-C' in FIG. 4E extends through the channel structure 406-2 where portions of the gate 404 extend along both side surfaces of the channel structure 406-2. The insulators 428 electrically isolate the gate 404 from the second S/D region 418-2 and the second D/S region 424-2, which are at opposite ends of the channel structure 406-2. The channel structure 406-2 with the second S/D region 418-2 at the first end and the second D/S region 424-2 at the second end form the second FET 402-2 in the second semiconductor layer 408-2. The cross-section D-D' in FIG. 4F extends through the channel structure 406-1, which also has the gate 404 extending along both sides surfaces. The insulators 428 electrically isolate the gate 404 from the first S/D region 418-1 and the first D/S region 424-1 at opposite ends of the channel structure 406-1. The channel structure 406-1 with the first S/D region 418-1 at the first end and the first D/S region 424-1 at the second end form the first FET 402-1 in the first semiconductor layer 408-1.

Figures 4G, 4H:
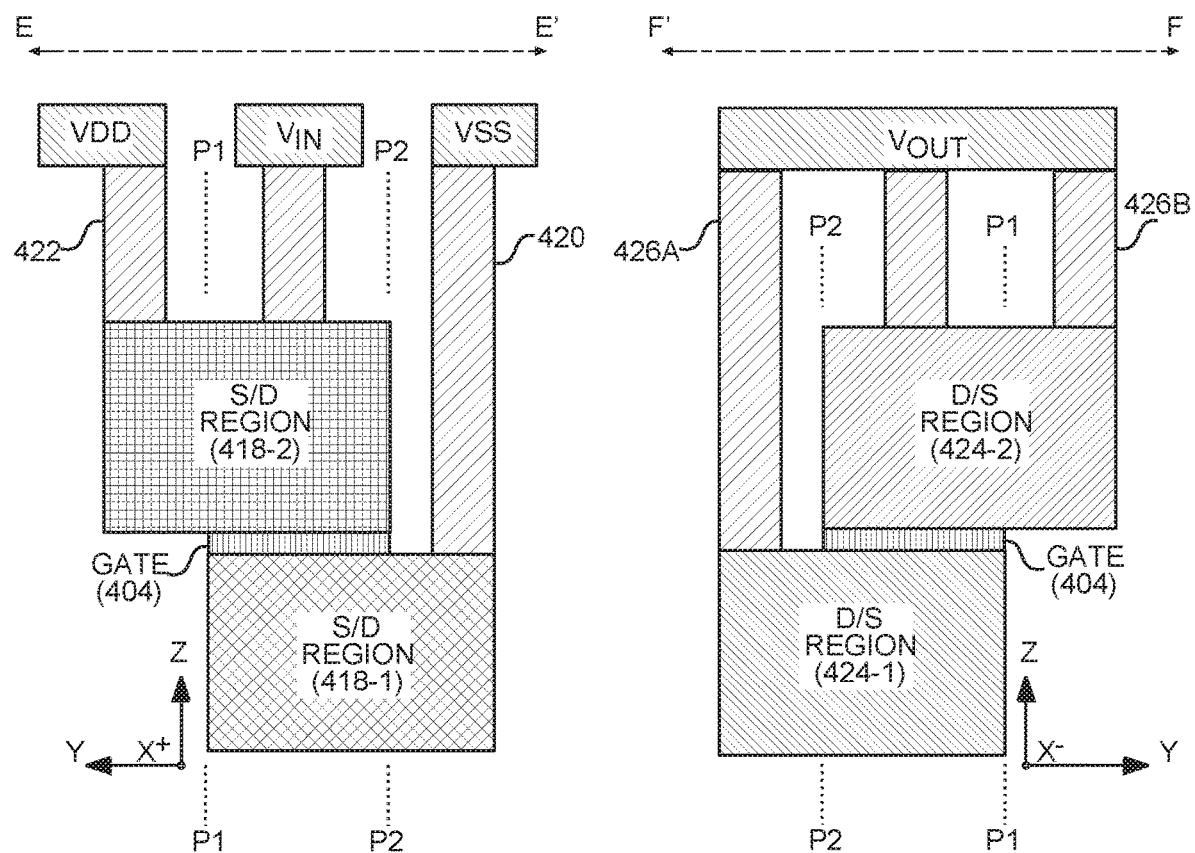
FIG. 4G is a cross-sectional view of the 3D CMOS cell circuit in FIG. 4A including source regions of the first FET and the second FET and vias to external interconnects.
FIG. 4H is a cross-sectional view of the 3D CMOS cell circuit in FIG. 4A including drain regions of the first FET and the second FET, and vias to external interconnects.

FIG. 4G is a view in the positive X-axis direction of a vertical cross section taken at line E-E' in FIG. 4A. FIG. 4G shows an example of cross-sections of the first and second S/D regions 418-1 and 418-2 at the first end of the channel structures 406-1 and 406-2. The gate 404 can be seen in FIG. 4G between the first and second S/D regions 418-1 and 418-2, indicating that the first and second S/D regions 418-1 and 418-2 are not in contact and are, therefore, not electrically coupled to each other within the first and second semiconductor layers 408-1 and 408-2. The first and second S/D regions 418-1 and 418-2 are coupled to the ground voltage VSS and the power supply voltage VDD in the metal layer 412 by the vias 420 and 422, respectively. In this regard, the cell circuit 400 does not include a vertical FET-to-FET interconnect between the first and second S/D regions 418-1 and 418-2.

FIG. 4H is a view in the negative X-axis direction of a vertical cross section taken at line F-F' in FIG. 4A. FIG. 4H shows the first and second D/S regions 424-1 and 424-2 at the second end of the channel structures 406-1 and 406-2, respectively. Here again, the gate 404 can be seen between the first and second D/S regions 424-1 and 424-2, indicating there is not electrical coupling between the first and second D/S regions 424-1 and 424-2 in the first and second semiconductor layers 408-1 and 408-2. The first and second D/S regions 424-1 and 424-2 are separately coupled to the output $V_{OUT}$ in the metal layer 412 by the vias 426A and 426B, respectively. In this regard, the cell circuit 400 does not include a vertical FET-to-FET interconnect between the first and second D/S regions 424-1 and 424-2.

The cell circuit 400 includes a vertical FET-to-FET interconnect 404 in the form of the gate 404, which electrically couples the gate region 414-1 to the gate region 414-2 and requires only a single via 416 to extend to the metal layer 412. However, FIGS. 4G and 4H show that the vias needed to electrically couple the S/D regions 418-1, 418-2 and the D/S regions 424-1, 424-2 to the metal layer 412 add to the horizontal area occupied by the cell circuit 400. In the second example of a physical layout for a CMOS cell circuit in FIGS. 6A-6H, discussed below, another vertical FET-to-FET interconnect is employed to further reduce the horizontal area and metal interconnects of the cell circuit.

Figure 5:
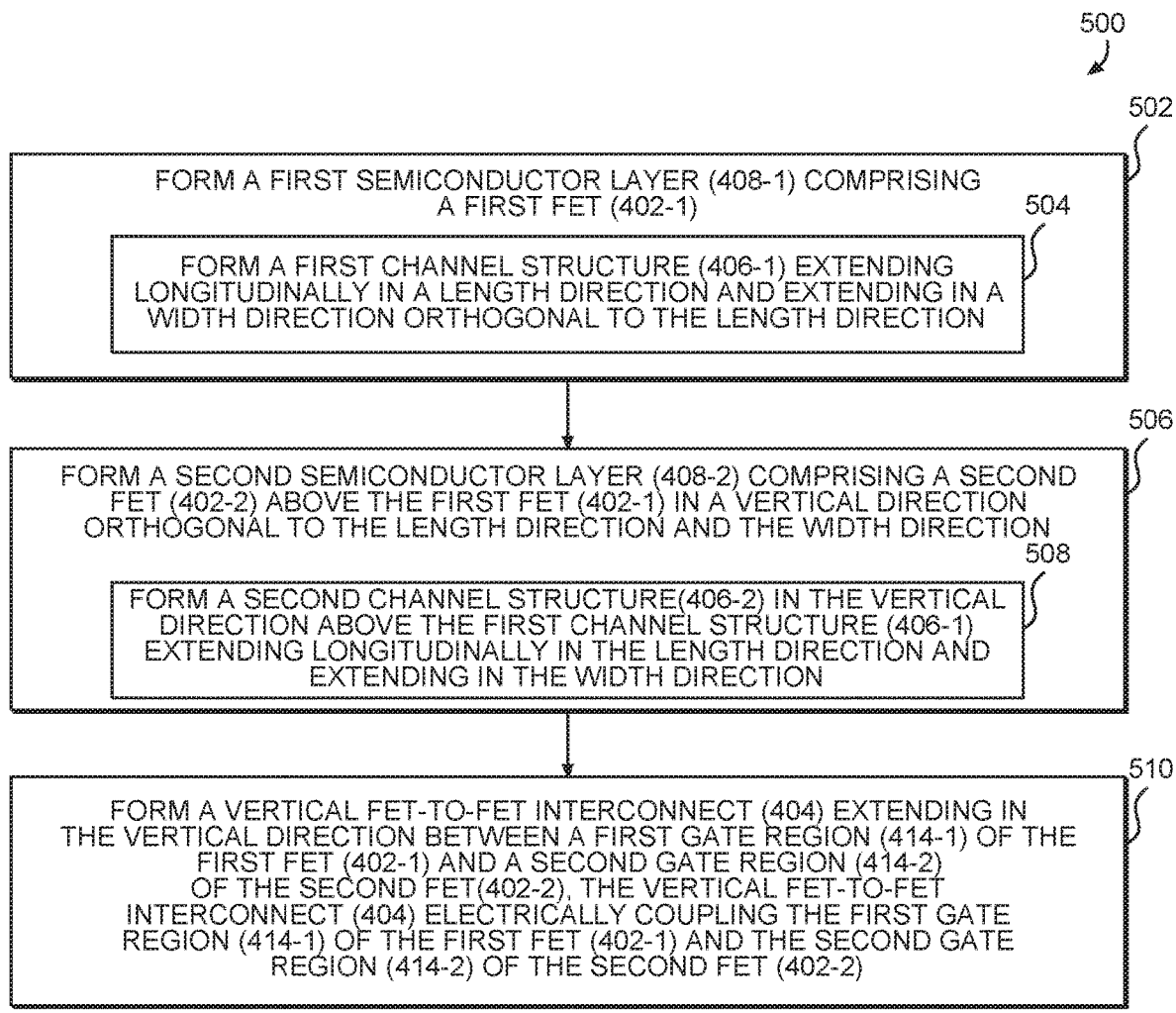
FIG. 5 is a flowchart illustrating an exemplary method for fabricating the 3D CMOS cell circuit in FIGS. 4A-4H.

FIG. 5 is a flowchart illustrating a method 500 of fabricating a 3D CMOS cell circuit, such as the cell circuit 400 in FIGS. 4A-4H. The method 500 includes forming the first semiconductor layer 408-1 comprising the first FET 402-1 (block 502). Forming the first semiconductor layer 408-1 includes forming the first channel structure 406-1 extending longitudinally in a length direction and extending in a width direction orthogonal to the length direction (block 504). The method 500 further includes forming the second semiconductor layer 408-2 comprising the second FET 402-2 above the first FET 402-1 in a vertical direction orthogonal to the length direction and the width direction (block 506). Forming the second semiconductor layer 408-2 includes forming the second channel structure 406-2 in the vertical direction above the first channel structure 406-1 extending longitudinally in the length direction and extending in the width direction (block 508). The method 500 further includes forming the vertical FET-to-FET interconnect 404 extending in the vertical direction between the first gate region 414-1 of the first FET 402-1 and the second gate region 414-2 of the second FET 402-2, the vertical FET-to-FET interconnect 404 electrically coupling the first gate region 414-1 of the first FET 402-1 and the second gate region 414-2 of the second FET 402-2 (block 510).

Another example of a layout of a vertically-integrated 3D CMOS cell circuit for the binary inverter logic gate 102 in FIG. 1 is illustrated in FIGS. 6A-6H. FIGS. 6A-6H are two-dimensional (2D) illustrations of respective horizontal and vertical cross-sections or cross-sectional views of a second example of a 3D CMOS cell circuit ("cell circuit") 600 corresponding to the CMOS cell circuit 100 in FIG. 1. The cell circuit 600 is similar in many aspects to the cell circuit 400, and the FIGS. 6A-6H of the cell circuit 600 correspond to the FIGS. 4A-4H of the cell circuit 400. In this regard, vertically-stacked FETs 602-1 and 602-2, and a gate 604 as a vertical FET-to-FET interconnect 604, reduce the horizontal area occupied by the cell circuit 600, and reduce congestion of metal layer interconnects to increase the density with which such cell circuits 600 can be organized in an IC.

The first FET 602-1 includes GAA semiconductor channel structures ("channel structures") 606-1 in a first semiconductor layer 608-1, and the second FET 602-2 includes channel structures 606-2 in a second semiconductor layer 608-2. As discussed above with regard to FIGS. 4A-4H, stacking the channel structures 606-1 and 606-2 reduces a horizontal area occupied by the cell circuit 600. In addition, the vertical FET-to-FET interconnect 604 reduces the horizontal area needed for vias and reduces the congestion of metal layer interconnects required for internal and external connections of the cell circuit 600. The perspective of each of the FIGS. 6A-6H is described with respect to X, Y, and Z axes, which are orthogonal to each other, as in FIGS. 4A-4H.

Figure 6A:
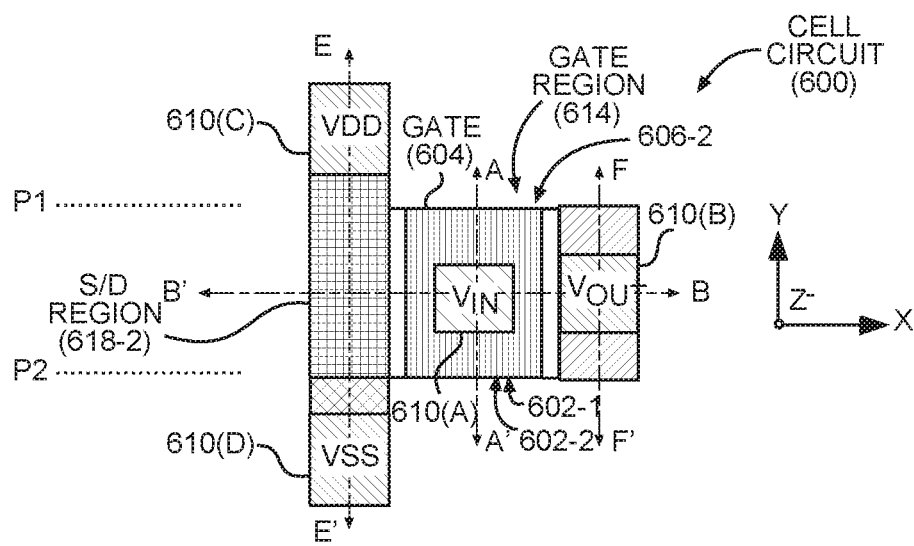
FIG. 6A is a top view of another exemplary layout of a vertically-integrated 3D CMOS cell circuit for the binary inverter logic gate in FIG. 1 including first and second FETs with vertically-stacked GAA semiconductor channel structures and plural vertical FET-to-FET interconnects.
Figure 6B:
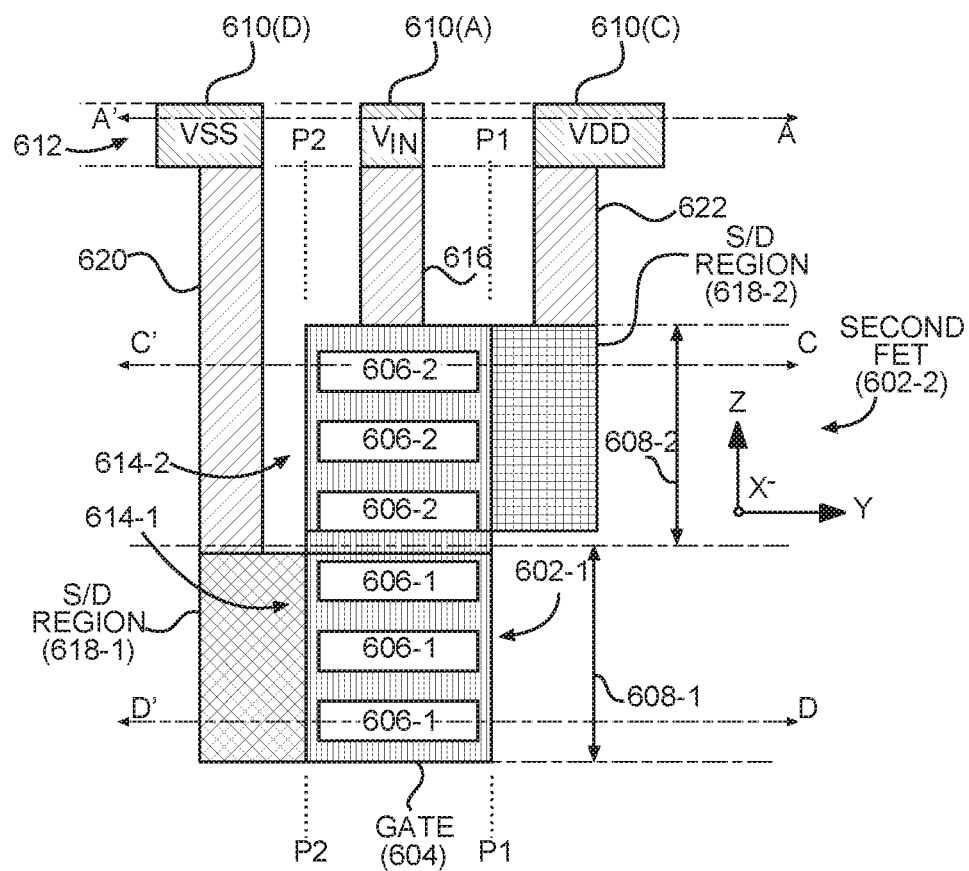

FIG. 6A shows horizontal cross-sections of metal traces 610(A)-610(D) in a metal layer 612. As discussed above with reference to FIGS. 4A-4H, the metal layer 612 is representative of one or more metal layers that may be needed to provide the appropriate internal and external connections for the cell circuit 600, but such metal layers will be referred to herein collectively as the metal layer 612. The metal layer 612 couples the cell circuit 600 to a ground voltage VSS at metal trace 610(D), to power supply voltage VDD at metal trace 610(C), to input $V_I$, at metal trace 610(A), and to output $V_{OUT}$ at metal trace 610(B). The vertical cross-section taken at line A-A' of FIG. 6A extends in the Y-axis direction (see FIGS. 6B and 6C) through gate region 614, which includes gate regions 614-1 and 614-2 of the channel structures 606-1 and 606-2, respectively, as shown in FIG. 6B. The vertical cross-section taken at line B-B' of FIG. 6A extends in the X-axis direction (see FIG. 6D) along longitudinal axes of the first FET 602-1 and the second FET 602-2. Cross-sections taken at lines E-E' and F-F' of FIG. 6A will be explained with reference to FIGS. 6G and 6H, respectively. Planes P1 and P2 are vertical planes (in the X axis direction) shown in each of FIGS. 6A-C and 6E-6H for perspective.

In particular, FIG. 6A shows the gate 604 extending over the top surface of the channel structure 606-2. The metal trace 610(A) couples the gate 604 to the input $V_{IN}$. As shown in FIG. 6B, the gate 604 is coupled to the metal trace 610(A) by a via 616. FIG. 6A further shows the metal trace 610(B) coupled to the output $V_{OUT}$. As explained further below, the metal trace 610(B) is shorter in horizontal length than the metal trace 410(B) in FIG. 4A. In addition, as discussed below, the cell circuit 600 couples to the metal trace 610(B) by only a single via. Consequently, the cell circuit 600 occupies less horizontal area than the cell circuit 400. The metal trace 610(C) is coupled to the power supply voltage VDD, and the metal trace 610(D) is coupled to the ground voltage VSS. Between the metal traces 610(C) and 610(D), a S/D region 618-2 is shown in the top view in FIG. 6A.

Figure 6C:
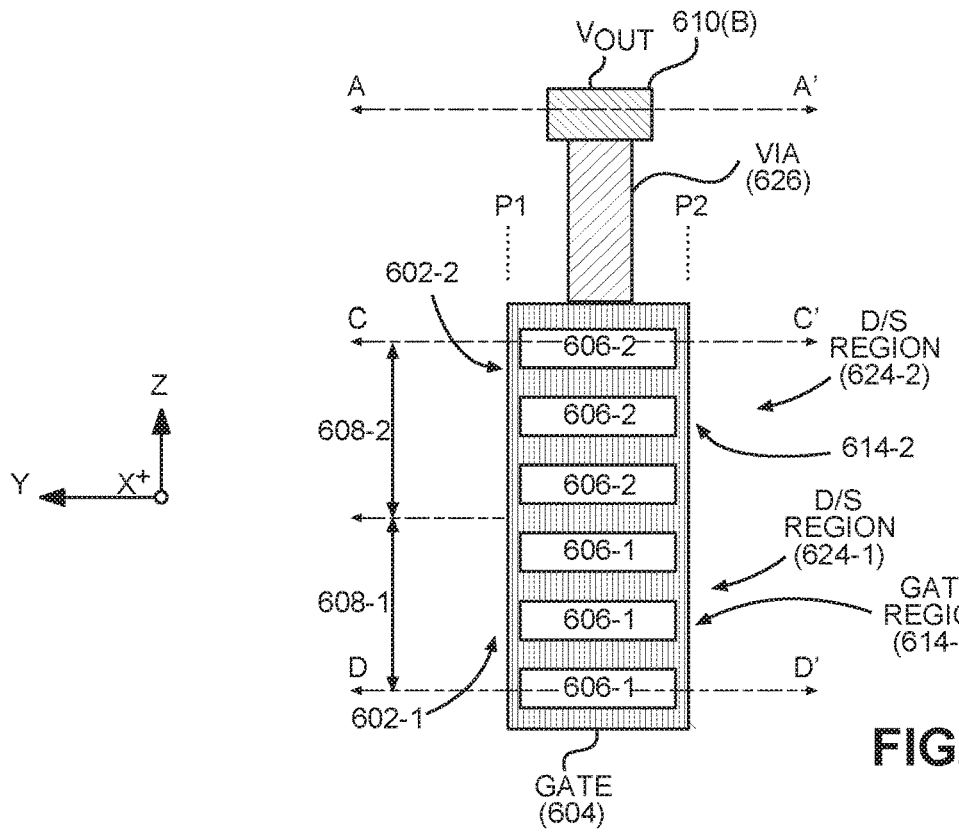

FIG. 6B is a view in the negative X-axis direction of the cell circuit 600 at the cross-section A-A' in the width direction of the channel structures 606-1 and 606-2. FIG. 6C is a view in the positive X-axis direction of the cell circuit 600 at the cross-section A-A'. FIG. 6B further illustrates that the vertically-stacked FETs 602-1 and 602-2 electrically coupled by the vertical FET-to-FET interconnect 604 reduces the horizontal area occupied by the cell circuit 600, and reduces congestion of metal layer interconnects to increase the density with which such cell circuits 600 can be organized in an IC. FIGS. 6B and 6C show the first and second semiconductor layers 608-1 and 608-2 in which the first FET 602-1 and the second FET 602-2, respectively, are formed. The channel structures 606-1 in the first semiconductor layer 608-1 are N-type (NMOS) semiconductor channels in this example. The channel structures 606-2 in the second semiconductor layer 608-2 in this example are P-type (PMOS) semiconductor channels.

In the cross-section A-A', the gate 604 electrically couples the gate region 614-1 of the first FET 602-1 and the gate region 614-2 the second FET 602-2, and is therefore referred to as the vertical FET-to-FET interconnect 604 that reduces a number of vias required for internal and external connections of the cell circuit 600. The gate 604 couples the gate regions 614-1 and 614-2 to the input $V_{IN}$ in the metal layer 612 by way of a single via 616, as opposed to employing separate vias for each of the gate regions 614-1 and 614-2.

FIG. 6B also shows a S/D region 618-1 coupled to the channel structures 606-1 in the first semiconductor layer 608-1, and the S/D region 618-2 coupled to the channel structures 606-2 in the second semiconductor layer 608-2. A via 620 electrically couples the S/D region 618-1 to the metal trace 610(D) to couple to the ground voltage VSS. Similarly, a via 622 electrically couples the S/D region 618-2 to the power supply voltage VDD by way of the metal trace 610(C). With respect to FIG. 6B, the cell circuit 600 appears to be very similar to the cell circuit 400 shown in FIG. 4B.

Referring to FIG. 6C, however, which shows the opposite face of the cross-section A-A', the cell circuit 600 differs from the cell circuit 400 in FIG. 4C because no D/S region can be seen in this view. The cross-sections of the channel structures 606-1 and 606-2 and the gate 604 around them are shown in FIG. 6C. In addition, a via 626 extends from the second semiconductor layer 608-2 to the metal trace 610(B).

Figure 6D:
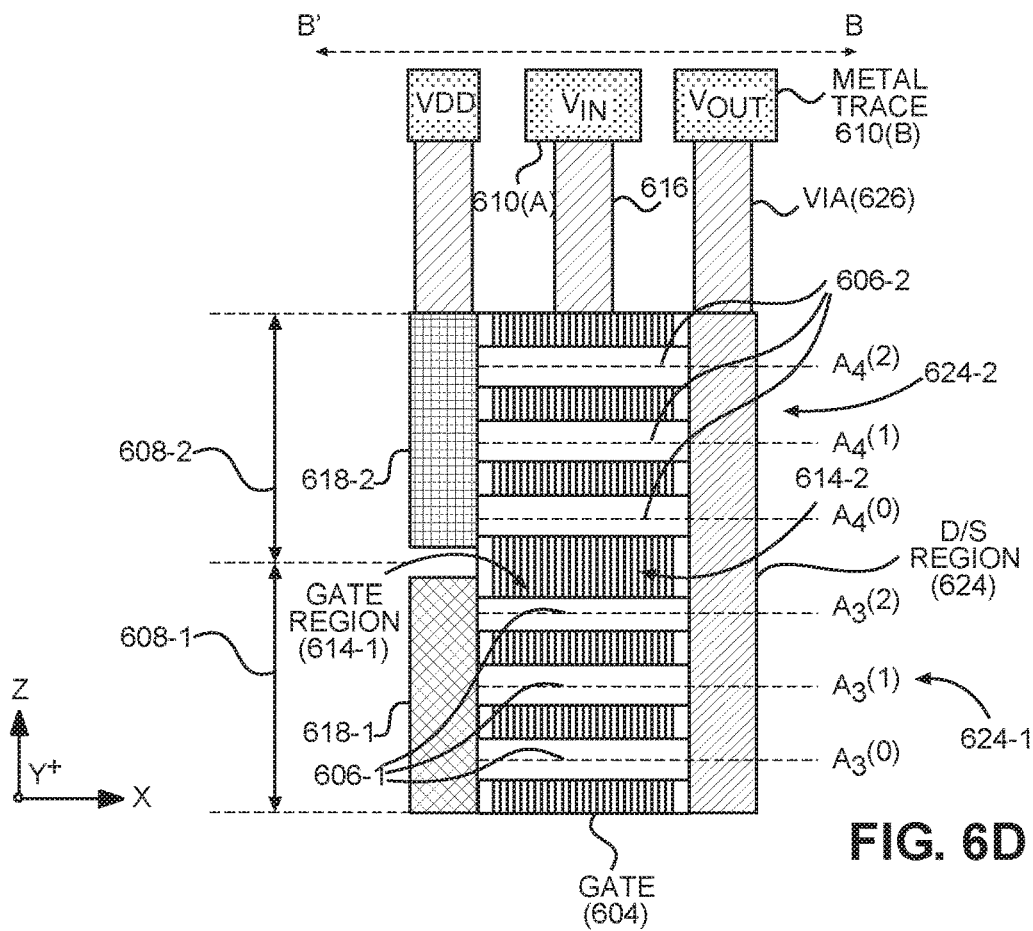

FIG. 6D is a view in the positive Y-axis direction of the vertical cross-section taken at line B-B' in FIG. 6A. FIG. 6D further illustrates that the gate 604 is a vertical FET-to-FET interconnect electrically coupling the vertically-stacked FETs 602-1 and 602-2 to reduce the horizontal area occupied by the cell circuit 600, and reduce congestion of metal layer interconnects to increase the density with which such cell circuits 600 can be organized in an IC. The vertical cross-section B-B' is orthogonal to the vertical cross-section A-A' in FIGS. 6B and 6C. FIG. 6D illustrates the channel structures 606-2 disposed above the channel structures 606-1 in the Z-axis direction to reduce the horizontal area occupied by the cell circuit 600. The vertical cross-section B-B' extends in the length direction along longitudinal axes $A_3(0)$-$A_3(2)$ of the channel structures 606-1 and longitudinal axes $A_4(0)$-$A_4(2)$ of the channel structures 606-2. As shown in FIG. 6D, a D/S region 624-1 of the channel structures 606-1 and a D/S region 624-2 of the channel structures 606-2 are combined as a D/S region 624. The D/S region 624 is at an opposite end, in the length direction, of the channel structures 606-1 and 606-2 from the S/D regions 618-1 and 618-2. Thus, the D/S region 624 is a vertical FET-to-FET interconnect 624 that electrically couples the D/S regions 624-1 and 624-2 to the output $V_{OUT}$ with a single via 626. The via 626 extends between the D/S region 624 and the metal trace 610(B). The gate regions 614-1 and 614-2, the S/D regions 618-1 and 618-2, and the D/S regions 624-1 and 624-2 are examples of terminal regions of the first FET 602-1 and the second FET 602-2 in FIGS. 6A-6H.

FIG. 6D shows that the cell circuit 600 includes a vertical FET-to-FET interconnect 604 electrically coupling the gate regions 614-1 and 614-2 to each other and to the metal layer 612 by the via 616, and another vertical FET-to-FET interconnect 624 electrically coupling the D/S regions 624-1 and 624-2 to the metal layer 612 by the via 626. In this manner, the horizontal area occupied by the cell circuit 600 is smaller than the horizontal area occupied by the cell circuit 400 because less horizontal area is required for vias. Additionally, by reducing a number of vias from the semiconductor layers 608-1 and 608-1 to the metal layer 612, the interconnect congestion in the metal layer 612 is reduced, which allows more densely-packed cell circuits in an IC.

FIGS. 6E and 6F are top views of horizontal cross-sections taken at lines C-C' and D-D', respectively, as indicated in FIGS. 6B and 6C. The horizontal cross-sections in FIGS. 6E and 6F correspond to the area of a single channel structure (e.g., 606-1) and required vias. By stacking the channel structures 606-1 and 606-2, an area of the cell circuit 600 is reduced. The cross-section C-C' in FIG. 6E extends through the channel structure 606-2, the gate 604 on the channel structure 606-2, and insulators 628, which electrically isolate the gate 604 from the S/D region 618-2 and the D/S region 624. The channel structures 606-2, with the S/D region 618-2 at a first end and the D/S region 624 at a second end, form the second FET 602-2.

The cross-section D-D' in FIG. 6F extends through the channel structure 606-1, the gate 604 extending along both sides surface, and the insulators 628. The channel structures 606-1, with the S/D region 618-1 at a first end and the D/S region 624 at a second end, form the first FET 602-1.

FIG. 6G is a view in the positive X-axis direction of a vertical cross-section taken at line E-E' in FIG. 6A. FIG. 6G shows the first and second S/D regions 618-1 and 618-2 at the first end of the channel structures 606-1 and 606-2. The gate 604 can be seen in FIG. 6G between the first and second S/D regions 618-1 and 618-2, indicating that first and second S/D regions 618-1 and 618-2 are not electrically coupled to each other. The first and second S/D regions 618-1 and 618-2 are coupled to the ground voltage VSS at metal trace 610(D) and the power supply voltage VDD at metal trace 610(C), respectively, in the metal layer 612 by the vias 620 and 622, respectively. In this regard, the cell circuit 600 does not include a vertical FET-to-FET interconnect between the first and second S/D regions 618-1 and 618-2.

FIG. 6H is a view in the negative X-axis direction of a vertical cross-section taken at line F-F' in FIG. 6A. FIG. 6H shows that the D/S regions 624-1 and 624-2 at the second end of the channel structures 606-1 and 606-2, respectively, are electrically coupled to each other by a vertical FET-to-FET interconnect 624 (D/S region 624). The D/S region 624 is coupled to the output $V_{OUT}$ on metal trace 610(B) in the metal layer 612 by the via 626. The vertical FET-to-FET interconnect 624 reduces the horizontal area occupied by the cell circuit 600 and reduces congestion of the metal layer 612 for the cell circuit 600.

Figure 7:
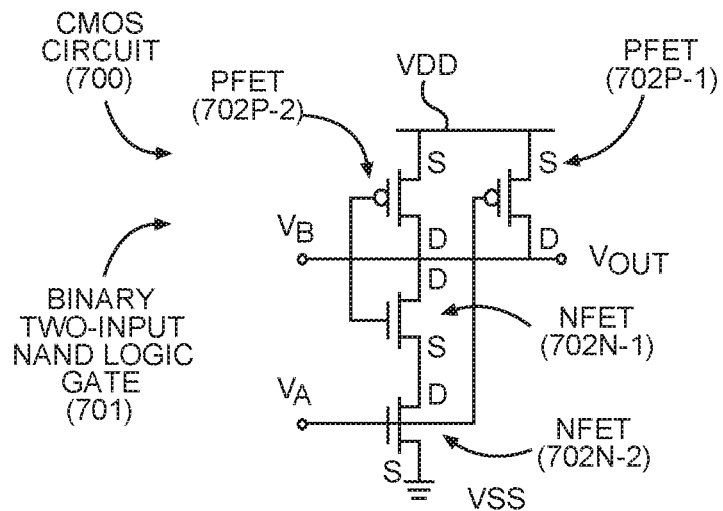
FIG. 7 is a schematic view of a CMOS circuit for a two-input binary NOT-AND (NAND) logic gate.
Figure 8A:
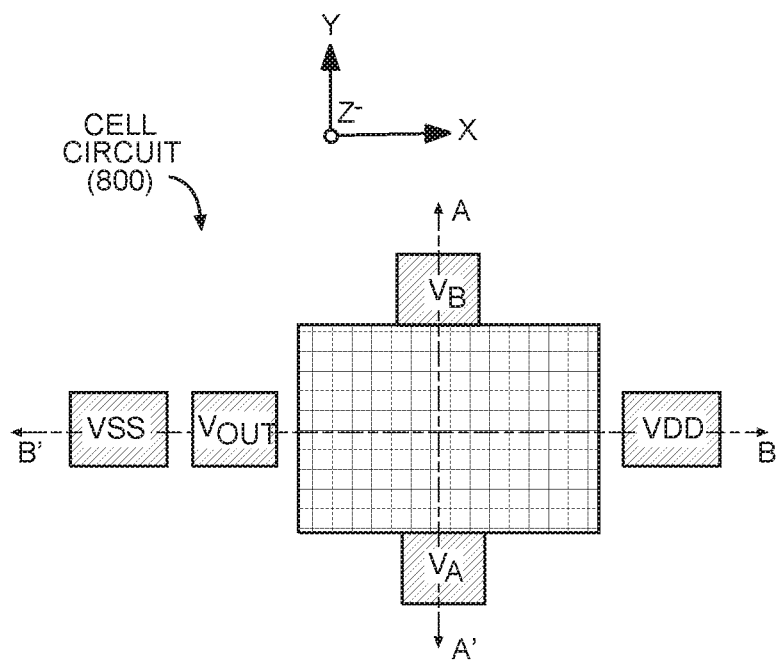
FIG. 8A is a top view of an exemplary layout of a vertically-integrated 3D CMOS cell circuit of the binary two-input NAND logic gate in FIG. 7, including first and second FETs with stacked GAA semiconductor channel structures and vertical FET-to-FET interconnects.
Figure 8B:
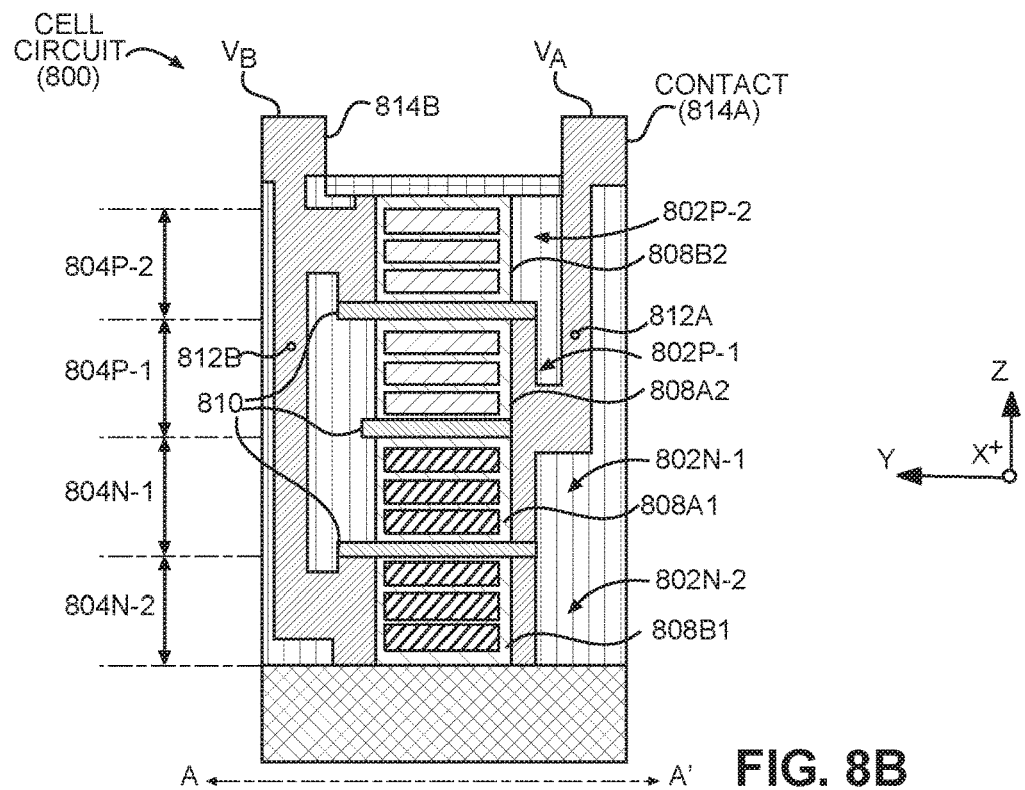
FIG. 8B is a cross-sectional view of the 3D CMOS cell circuit of the binary two-input NAND logic gate in FIG. 8A.
Figure 8C:
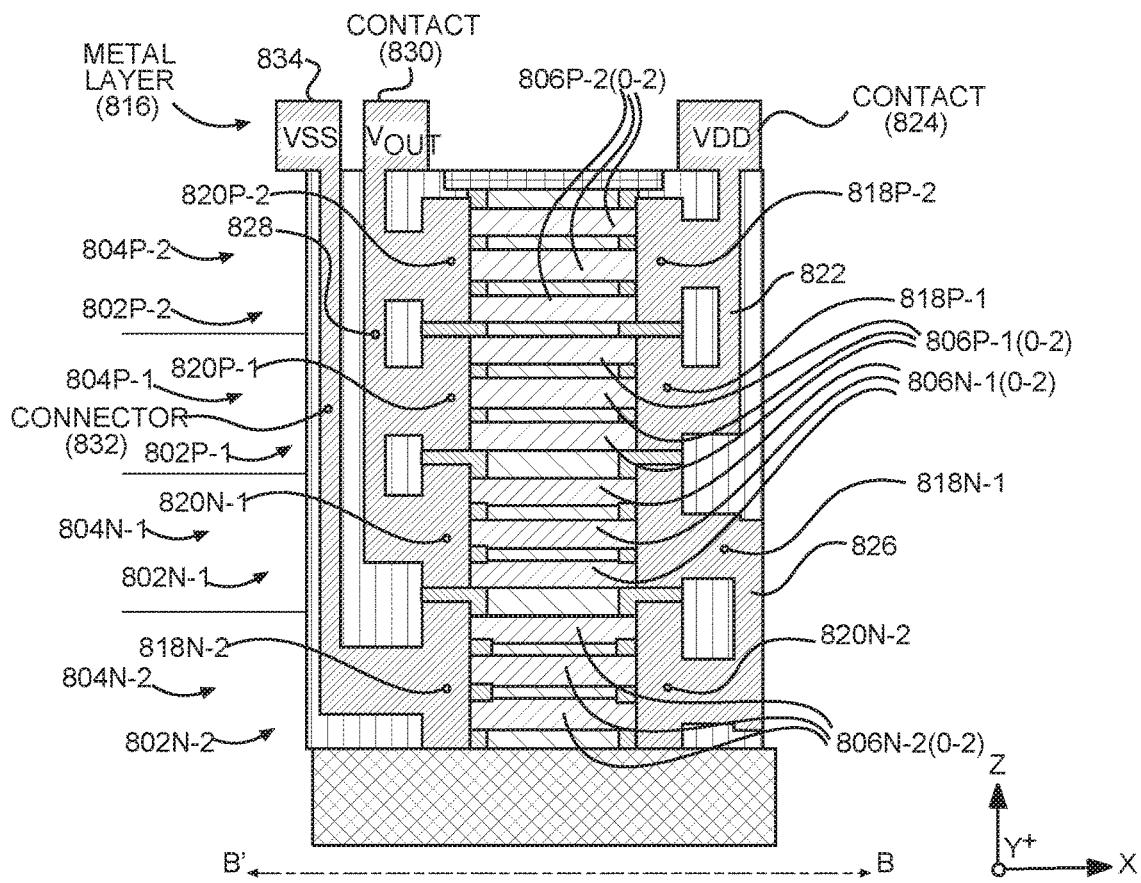
FIG. 8C is a cross-sectional view of the 3D CMOS cell circuit of the binary two-input NAND logic gate in FIG. 8B.

FIG. 7 is a schematic diagram of a CMOS circuit 700 of a binary two-input NOT-AND (NAND) logic gate 701, including PFETs 702P-1 and 702P-2 and NFETs 702N-1 and 702N-2. According to the function of a NAND logic gate, the output voltage $V_{OUT}$ is only low (e.g., 0 Volts (V)) if the input voltages $V_A$ and $V_B$ are both high (e.g., 5 V), otherwise the voltage $V_{OUT}$ remains high. The CMOS circuit 700 is an example of another logic gate that can be implemented in a 3D CMOS cell circuit ("cell circuit") 800 as illustrated in FIGS. 8A-8C to reduce the horizontal area occupied on a substrate by reducing the area occupied by FETs and vias, and the reduction of vias also reduces the congestion of metal layers needed for internal and external interconnects. The CMOS circuit 700 includes external terminals for connecting to a power supply voltage VDD, a ground voltage VSS, inputs $V_A$ and $V_B$, and an output $V_{OUT}$.

An example of a layout of a vertically-integrated 3D CMOS cell circuit of the binary two-input NAND logic gate 701 in FIG. 7 is illustrated in FIGS. 8A-8C. FIGS. 8A-8C are two-dimensional (2D) illustrations of respective horizontal and vertical cross-sections or cross-sectional views of an example of the cell circuit 800. Aspects of the layout, including vertically-stacked FETs 802P-1, 802P-2, 802N-1, and 802N-2 and vertical FET-to-FET interconnects, reduce the horizontal area occupied by the cell circuit 800, and increase the density with which such cell circuits 800 can be organized in an IC.

FIG. 8A is a top view of the cell circuit 800 occupying a horizontal area in the X-axis and Y-axis directions. FIG. 8A is similar to FIG. 4A, except that the cell circuit 800 is a two-input logic gate with inputs $V_A$ and $V_B$ rather than the single input $V_{IN}$ in the cell circuit 400. Even though the cell circuit 800 includes more FETs (as shown in FIGS. 8B and 8C) than the cell circuit 400, the FETs of the cell circuit 800 are vertically integrated so they occupy about the same horizontal area as the cell circuit 400, or the area of a single FET.

FIG. 8B is a vertical cross-section taken at line A-A' of the cell circuit 800 in FIG. 8A. FIGS. 8B and 8C show that the cell circuit 800 includes PFETs 802P-1 and 802P-2 in PMOS layers 804P-1 and 804P-2. The PFETs 802P-1 and 802P-2 are stacked above NFETs 802N-1 and 802N-2, which are in NMOS layers 804N-1 and 804N-2, respectively. The PFETs 802P-1 and 802P-2 include channel structures 806P-1(0)-806P-1(2) and 806P-2(0)-806P-2(2). The NFETs 802N-1 and 802N-2 include channel structures 806N-1(0)-806N-1(2) and 806N-2(0)-806N-2(2). All the channel structures in the cell circuit 800 are referred to collectively as channel structures 806. The channel structures 806 are vertically stacked to reduce the horizontal area occupied by the cell circuit 800. The channel structures 806 all have longitudinal axes extending in the length direction (X-axis direction) and also extend in the width direction (Y-axis direction).

FIG. 8B shows cross-sections of the channel structures 806 in the width direction (Y-axis direction) and also shows, in order in the positive Z-axis direction, cross-sections of gate regions 808B1, 808A1, 808A2, and 808B2. The gate regions 808A1, 808A2, 808B1, and 808B2 are separated vertically by insulator layers 810, but gate regions 808A1 and 808A2 are electrically coupled to each other by a vertical FET-to-FET interconnect 812A, and gate regions 808B1 and 808B2 are electrically coupled to each other by a vertical FET-to-FET interconnect 812B. The vertical FET-to-FET interconnect 812A also forms a contact 814A. From the contact 814A, a via (not shown) can couple the gate regions 808A1 and 808A2 to input $V_A$ in metal layer 816 above the cell circuit 800. In this manner, the gate region 808A1 for the NFET 802N-1 and the gate region 808A2 for the PFET 802P-1 are electrically coupled to each other and to the input $V_A$. The vertical FET-to-FET interconnect 812B forms a contact 814B. From the contact 814B, a via (not shown) can couple the gate regions 808B1 and 808B2 to input $V_B$ in the metal layer 816 above the cell circuit 800. In this manner, the gate region 808B1 for the NFET 802N-2 and the gate region 808B2 for the PFET 802P-2 are electrically coupled to each other and to the input $V_B$. The metal layer 816 represents one or more metal layers referred to herein collectively as metal layer 816.

FIG. 8C is a vertical cross-section taken at line B-B' of the cell circuit 800 in FIG. 8A. FIG. 8C shows cross-sections of the channel structures 806 in the length direction (X-axis direction). Thus, FIG. 8C shows D/S region 820N-2 and S/D regions 818N-1, 818P-1, and 818P-2 at a first end (right side in FIG. 8C) of the channel structures 806. S/D region 818N-2 and D/S regions 820N-1, 820P-1, and 820P-2 are at the opposite end, in the length direction, of the channel structures 806. In FIG. 8C, the PFET 802P-1 in the PMOS layer 804P-1 is stacked above the NFET 802N-1 in the NMOS layer 804N-1, and the PFET 802P-2 in the PMOS layer 804P-2 is disposed above the PMOS layer 804P-1. The NFET 802N-2 in the NMOS layer 804N-2 is disposed beneath the NMOS layer 804N-1.

The S/D regions 818P-1 and 818P-2 are electrically coupled to each other by a vertical FET-to-FET interconnect 822, which also provides a contact 824 for connection to the power supply voltage VDD. A vertical FET-to-FET interconnect 826 allows S/D region 818N-1 to be electrically coupled to the D/S region 820N-2. A vertical extent of the vertical FET-to-FET interconnect 826 is limited to the NMOS layer 804N-1 and the NMOS layer 804N-2, forming an internal circuit node of the cell circuit 800 that does not include a via connection to the metal layer 816. In other words, the vertical FET-to-FET interconnect 826 does not extend above the NMOS layer 804N-1, which reduces the horizontal area needed by the cell circuit 800 for vertical connections and also reduces congestion of the metal layer 816.

The D/S regions 820P-1, 820P-2, and the D/S region 820N-1 are all electrically coupled to each other by a vertical FET-to-FET interconnect 828, which also includes a contact 830 on which a via may be formed to connect to the output $V_{OUT}$. A connector 832 with a contact 834 provides a connection from the S/D region 818N-2 to the ground voltage VSS. The gate regions 808B1 and 808A1, the S/D regions 818N-1 and 818N-2, and the D/S regions 820N-1 and 820N-2 are examples of terminal regions of the NFETs 802N-1 and 802N-2 in FIGS. 8A-8C. The gate regions 808B2 and 808A2, the S/D regions 818P-1 and 818P-2, and the D/S regions 820P-1 and 820P-2 are examples of terminal regions of the PFETs 802P-1 and 802P-2 in FIGS. 8A-8C.

Although the cell circuit 800 includes four (4) FETs (802P-1, 802P-2, 802N-1, and 802N-2), they are vertically integrated by stacking the channel structures 806 to reduce the horizontal area occupied by the cell circuit 800. In addition, each of the FETs includes S/D, gate, and D/S connections. However, by employing vertical FET-to-FET interconnects within the semiconductor layers, rather than connecting every S/D region, gate region, and D/S region to the metal layers separately, the cell circuit 800 is further reduced in metal layer congestion.

3D CMOS cell circuits including vertically-integrated FETs including vertically-stacked semiconductor channel structures and vertical FET-to-FET interconnects to electrically couple terminal regions of the respective FETs to reduce horizontal area, reduce via connections, and reduce metal layer congestion, as illustrated in any of FIGS. 4A-4H, 6A-6H, and 8A-8C, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
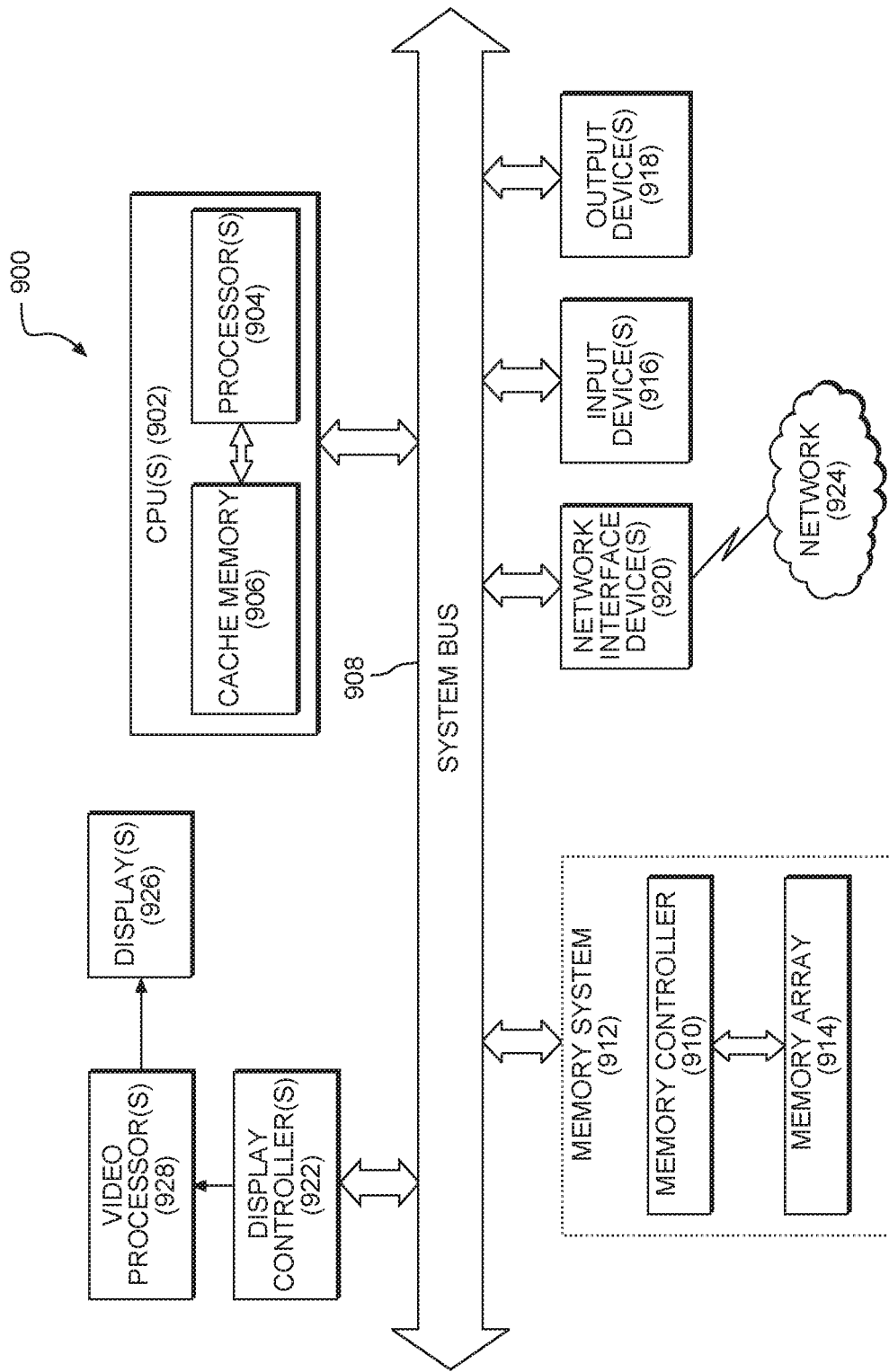
FIG. 9 is a block diagram of an exemplary processor-based system that can include a 3D CMOS cell circuit including a first FET vertically integrated with a second FET by vertically stacking a semiconductor channel structure of the first FET beneath a semiconductor channel structure of the second FET and including vertical FET-to-FET interconnects to reduce a footprint and metal layer interconnect congestion of the 3D CMOS cell circuit including, but not limited to, the circuits in FIGS. 4A-4H, 6A-6H, and 8A-8C.

In this regard, FIG. 9 illustrates an example of a processor-based system 900 including 3D CMOS cell circuits including vertically-integrated FETs including vertically-stacked semiconductor channel structures and vertical FET-to-FET interconnects to electrically couple terminal regions of the respective FETs to reduce horizontal area, reduce via connections, and reduce metal layer congestion, as illustrated in any of FIGS. 4A-4H, 6A-6H, and 8A-8C, and according to any aspects disclosed herein. In this example, the processor-based system 900 includes one or more central processor units (CPUs) 902, which may also be referred to as CPU or processor cores, each including one or more processors 904. The CPU(s) 902 may have cache memory 906 coupled to the processor(s) 904 for rapid access to temporarily stored data. As an example, the processor(s) 904 could include 3D CMOS cell circuits including vertically-integrated FETs including vertically-stacked semiconductor channel structures and vertical FET-to-FET interconnects to electrically couple terminal regions of the respective FETs to reduce horizontal area, reduce via connections, and reduce metal layer congestion, as illustrated in any of FIGS. 4A-4H, 6A-6H, and 8A-8C, and according to any aspects disclosed herein. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided, wherein each system bus 908 constitutes a different fabric.

Other master and slave devices can be connected to the system bus 908. As illustrated in FIG. 9, these devices can include a memory system 912 that includes the memory controller 910 and one or more memory arrays 914, one or more input devices 916, one or more output devices 918, one or more network interface devices 920, and one or more display controllers 922, as examples. Each of the memory system 912, the one or more input devices 916, the one or more output devices 918, the one or more network interface devices 920, and the one or more display controllers 922 can include 3D CMOS cell circuits including vertically-integrated FETs including vertically-stacked semiconductor channel structures and vertical FET-to-FET interconnects to electrically couple terminal regions of the respective FETs to reduce horizontal area, reduce via connections, and reduce metal layer congestion, as illustrated in any of FIGS. 4A-4H, 6A-6H, and 8A-8C, and according to any aspects disclosed herein. The input device(s) 916 can include any type of input device, including, but not limited to, input keys, switches, voice processors, etc. The output device(s) 918 can include any type of output device, including, but not limited to, audio, video, other visual indicators, etc. The network interface device(s) 920 can be any device configured to allow exchange of data to and from a network 924. The network 924 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 920 can be configured to support any type of communications protocol desired.

The CPU(s) 902 may also be configured to access the display controller(s) 922 over the system bus 908 to control information sent to one or more displays 926. The display controller(s) 922 sends information to the display(s) 926 to be displayed via one or more video processors 928, which process the information to be displayed into a format suitable for the display(s) 926. The display(s) 926 can include any type of display, including, but not limited to, a cathode ray tube (CRT), a liquid crystal display (LCD), a plasma display, a light emitting diode (LED) display, etc. The display controller(s) 922, display(s) 926, and/or the video processor(s) 928 can include 3D CMOS cell circuits including vertically-integrated FETs including vertically-stacked semiconductor channel structures and vertical FET-to-FET interconnects to electrically couple terminal regions of the respective FETs to reduce horizontal area, reduce via connections, and reduce metal layer congestion, as illustrated in any of FIGS. 4A-4H, 6A-6H, and 8A-8C, and according to any aspects disclosed herein.

Figure 10:
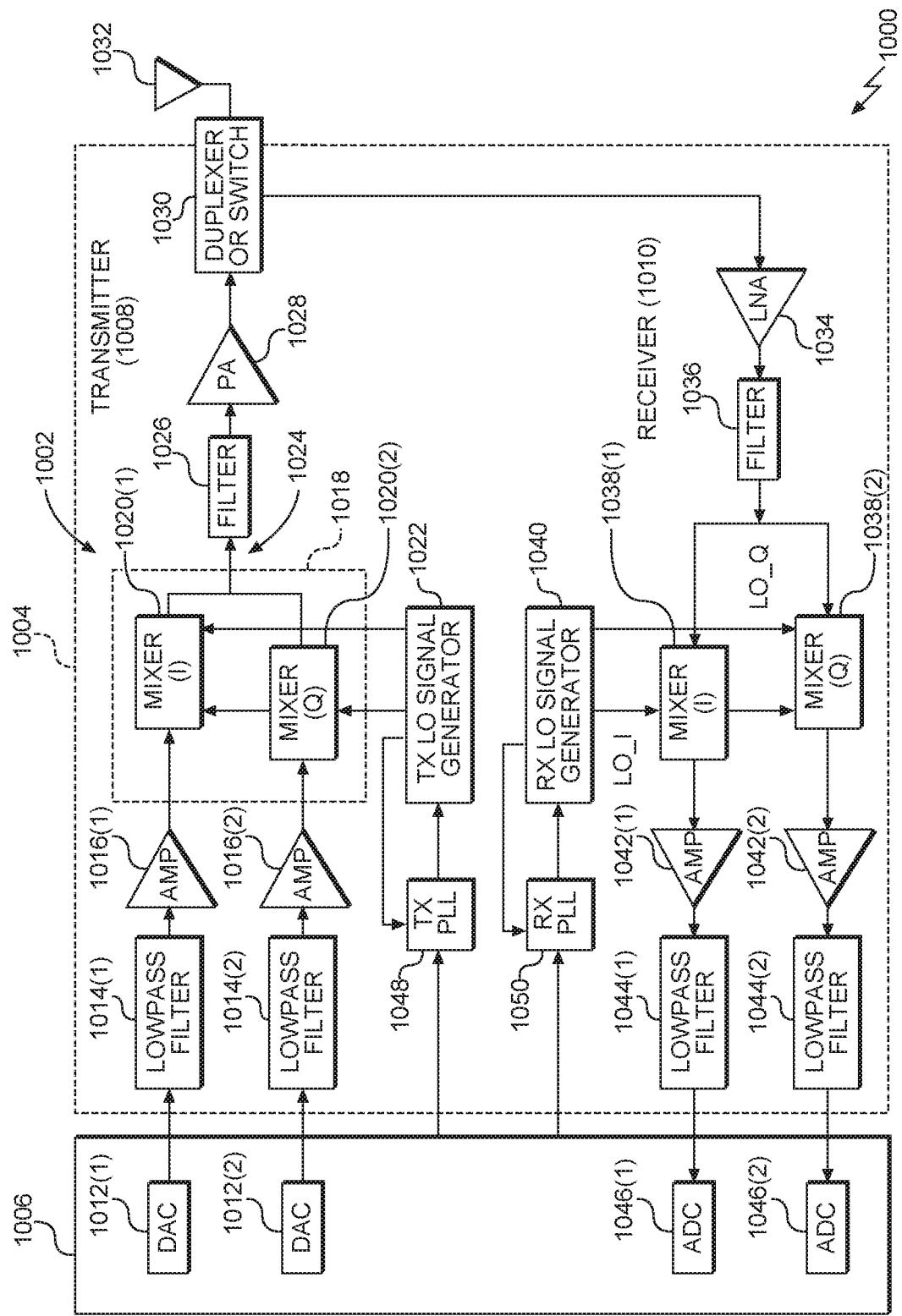
FIG. 10 is a block diagram of an exemplary wireless communications device that includes radio frequency (RF) components formed from an integrated circuit (IC), wherein any of the components therein can include a 3D CMOS cell circuit including, but not limited, to the circuits in FIGS. 4A-4H, 6A-6H, and 8A-8C.

FIG. 10 illustrates an exemplary wireless communications device 1000 that includes radio frequency (RF) components formed from an IC 1002, wherein any of the components therein can include 3D CMOS cell circuits including vertically-integrated FETs including vertically-stacked semiconductor channel structures and vertical FET-to-FET interconnects to electrically couple terminal regions of the respective FETs to reduce horizontal area, reduce via connections, and reduce metal layer congestion, as illustrated in any of FIGS. 4A-4H, 6A-6H, and 8A-8C, and according to any aspects disclosed herein. The wireless communications device 1000 may include or be provided in any of the above-referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RF ICs (RFICs), mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1010. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMPs) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmitted RF signal. The transmitted RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Downconversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by AMPs 1042(1), 1042(2) and further filtered by lowpass filters 1044(1), 1044(2) to obtain I and Q analog input signals, which are provided to the data processor 1006. In this example, the data processor 1006 includes analog-to-digital converters (ADCs) 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. A complementary metal-oxide semiconductor (CMOS) cell circuit, comprising:
   a first semiconductor layer, comprising:
      a first Field-Effect Transistor (FET) comprising a first semiconductor channel structure having a first longitudinal axis in a length direction and extending in a width direction orthogonal to the length direction;
   a second semiconductor layer disposed above the first semiconductor layer in a vertical direction orthogonal to the length direction and the width direction, the second semiconductor layer comprising:
      a second FET comprising a second semiconductor channel structure having a second longitudinal axis in the length direction and extending in the width direction, the second FET disposed above the first FET in the vertical direction; and
   a vertical FET-to-FET interconnect extending in the vertical direction outside of a space between the first semiconductor channel structure and the second semiconductor channel structure, directly between a first terminal region of the first FET and a first terminal region of the second FET and without extending beyond the first terminal region of the second FET in the vertical direction, the vertical FET-to-FET interconnect electrically coupling the first terminal region of the first FET and the first terminal region of the second FET.

2. The CMOS cell circuit of claim 1, wherein:
the first terminal region of the first FET comprises a first gate region; and
the first terminal region of the second FET comprises a second gate region.

3. The CMOS cell circuit of claim 1, wherein:
the first terminal region of the first FET comprises a first drain/source (D/S) region; and
the first terminal region of the second FET comprises a second D/S region.

4. The CMOS cell circuit of claim 1, further comprising a second vertical FET-to-FET interconnect configured to electrically couple a second terminal region of the first FET and a second terminal region of the second FET.

5. The CMOS cell circuit of claim 4, wherein:
the second terminal region of the first FET comprises a first source/drain (S/D) region; and
the second terminal region of the second FET comprises a second S/D region.

6. The CMOS cell circuit of claim 1, further comprising a vertical interconnect access (via) coupled to the vertical FET-to-FET interconnect and configured to electrically couple the vertical FET-to-FET interconnect to a metal interconnect layer above the second semiconductor layer.

7. The CMOS cell circuit of claim 1, wherein:
the first FET comprises a P-type FET (PFET); and
the second FET comprises an N-type FET (NFET).

8. The CMOS cell circuit of claim 1, wherein:
the first FET comprises an N-type FET (NFET); and
the second FET comprises a P-type FET (PFET).

9. The CMOS cell circuit of claim 1, wherein:
the first FET further comprises:
 a first source/drain (S/D) region at a first end, in the length direction, of the first semiconductor channel structure;
 a first drain/source (D/S) region at a second end, in the length direction, of the first semiconductor channel structure; and
 a first gate region between the first S/D region and the first D/S region in the length direction; and
the second FET further comprises:
 a second S/D region at a first end, in the length direction, of the second semiconductor channel structure;
 a second D/S region at a second end, in the length direction, of the second semiconductor channel structure; and
 a second gate region between the second S/D region and the second D/S region in the length direction.

10. The CMOS cell circuit of claim 9, wherein:
the second gate region of the second FET is directly above the first gate region of the first FET in the vertical direction;
the second S/D region of the second FET is directly above the first S/D region of the first FET in the vertical direction; and
the second D/S region of the second FET is directly above the first D/S region of the first FET in the vertical direction.

11. The CMOS cell circuit of claim 10, wherein the vertical FET-to-FET interconnect extends directly between the first terminal region of the first FET and the first terminal region of the second FET.

12. The CMOS cell circuit of claim 1, further comprising:
a third semiconductor layer disposed above the second semiconductor layer in the vertical direction, the third semiconductor layer comprising:
 a third FET comprising a third semiconductor channel structure having a third longitudinal axis in the length direction and extending in the width direction.

13. The CMOS cell circuit of claim 12, further comprising:
a fourth semiconductor layer disposed beneath the first semiconductor layer in the vertical direction, the fourth semiconductor layer comprising:
 a fourth FET comprising a fourth semiconductor channel structure having a fourth longitudinal axis in the length direction and extending in the width direction.

14. The CMOS cell circuit of claim 13, further comprising a second vertical FET-to-FET interconnect configured to electrically couple a third terminal region of the first FET and a second terminal region of the fourth FET.

15. The CMOS cell circuit of claim 14, further comprising a third vertical FET-to-FET interconnect configured to electrically couple a third terminal region of the second FET and a third terminal region of the third FET.

16. The CMOS cell circuit of claim 15, further comprising a fourth vertical FET-to-FET interconnect configured to electrically couple a second terminal region of the first FET, a second terminal region of the second FET, and a second terminal region of the third FET.

17. The CMOS cell circuit of claim 1, further comprising:
a third semiconductor layer disposed beneath the first semiconductor layer in the vertical direction, the third semiconductor layer comprising:
 a third FET comprising a third semiconductor channel structure having a third longitudinal axis in the length direction and extending in the width direction.

18. The CMOS cell circuit of claim 1, wherein a vertical extent of the vertical FET-to-FET interconnect is limited to the first semiconductor layer and the second semiconductor layer.

19. The CMOS cell circuit of claim 1, comprising an integrated circuit (IC).

20. The CMOS cell circuit of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

21. A method of fabricating a complementary metal-oxide semiconductor (CMOS) cell circuit, the method comprising:
forming a first semiconductor layer comprising a first Field-Effect Transistor (FET), comprising:
 forming a first semiconductor channel structure extending longitudinally in a length direction and extending in a width direction orthogonal to the length direction;
forming a second semiconductor layer comprising a second FET above the first FET in a vertical direction orthogonal to the length direction and the width direction, comprising:

forming a second semiconductor channel structure above the first semiconductor channel structure in the vertical direction, the second semiconductor channel structure extending longitudinally in the length direction and extending in the width direction; and forming a vertical FET-to-FET interconnect extending in the vertical direction outside of a space between the first semiconductor channel structure and the second semiconductor channel structure, directly between a first terminal region of the first FET and a first terminal region of the second FET and without extending beyond the first terminal region of the second FET in the vertical direction, the vertical FET-to-FET interconnect electrically coupling the first terminal region of the first FET and the first terminal region of the second FET.

22. The method of claim 21, wherein:

forming the first semiconductor channel structure further comprises forming one of a P-type semiconductor channel structure and an N-type semiconductor channel structure; and forming the second semiconductor channel structure further comprises forming the other one of the P-type semiconductor channel structure and the N-type semiconductor channel structure.

23. The method of claim 21, wherein:

forming the first semiconductor layer further comprises:
   forming a first source/drain (S/D) region at a first end, in the length direction, of the first semiconductor channel structure; and
   forming a first drain/source (D/S) region at a second end, in the length direction, of the first semiconductor channel structure; and forming the second semiconductor layer further comprises:
   forming a second S/D region at a first end, in the length direction, of the second semiconductor channel structure; and
   forming a second D/S region at a second end, in the length direction, of the second semiconductor channel structure.

24. The method of claim 21, further comprising forming a vertical interconnect access (via) coupled to the vertical FET-to-FET interconnect, the via configured to electrically couple the vertical FET-to-FET interconnect to a metal interconnect layer above the second semiconductor layer.

25. The method of claim 21, wherein forming the second semiconductor layer further comprises forming the second semiconductor layer separately from the first semiconductor layer and bonding the second semiconductor layer to the first semiconductor layer.

26. The method of claim 21, wherein forming the second semiconductor layer further comprises forming the second semiconductor layer on the first semiconductor layer.

* * * * *